US011610885B2

(12) United States Patent
Chen et al.

(10) Patent No.: US 11,610,885 B2
(45) Date of Patent: Mar. 21, 2023

(54) METHOD FOR FORMING SEMICONDUCTOR STRUCTURE

(71) Applicant: Taiwan Semiconductor Manufacturing Co., Ltd., Hsinchu (TW)

(72) Inventors: Chia-Cheng Chen, Hsinchu (TW); Chia-Ling Chan, New Taipei (TW); Liang-Yin Chen, Hsinchu (TW); Huicheng Chang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 330 days.

(21) Appl. No.: 16/924,541

(22) Filed: Jul. 9, 2020

(65) Prior Publication Data
US 2020/0343242 A1   Oct. 29, 2020

Related U.S. Application Data

(62) Division of application No. 15/652,719, filed on Jul. 18, 2017, now Pat. No. 10,727,226.

(51) Int. Cl.
| | |
|---|---|
| *H01L 21/265* | (2006.01) |
| *H01L 21/22* | (2006.01) |
| *H01L 27/088* | (2006.01) |
| *H01L 29/06* | (2006.01) |
| *H01L 21/8234* | (2006.01) |
| *H01L 29/66* | (2006.01) |
| *H01L 21/8238* | (2006.01) |
| *H01L 27/092* | (2006.01) |

(Continued)

(52) U.S. Cl.
CPC .. *H01L 27/0886* (2013.01); *H01L 21/823418* (2013.01); *H01L 21/823431* (2013.01); *H01L 21/823468* (2013.01); *H01L 21/823481* (2013.01); *H01L 21/823814* (2013.01); *H01L 21/823821* (2013.01); *H01L 27/0924* (2013.01); *H01L 29/0649* (2013.01); *H01L 29/66545* (2013.01); *H01L 29/785* (2013.01); *H01L 21/845* (2013.01); *H01L 27/1211* (2013.01)

(58) Field of Classification Search
None
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |

(Continued)

*Primary Examiner* — Joseph C. Nicely
*Assistant Examiner* — Lamont B Koo
(74) *Attorney, Agent, or Firm* — Birch, Stewart, Kolasch & Birch, LLP

(57) ABSTRACT

A method for forming a semiconductor structure includes forming a fin structure over a substrate. The method also includes forming a gate structure across the fin structure. The method also includes depositing a dopant source layer over the gate structure. The method also includes driving dopants of the dopant source layer into the fin structure. The method also includes removing the dopant source layer. The method also includes annealing the dopants in the fin structure to form a doped region. The method also includes etching the doped region and the fin structure below the doped region to form a recess. The method also includes growing a source/drain feature in the recess.

20 Claims, 26 Drawing Sheets

(51) Int. Cl.
  *H01L 29/78* (2006.01)
  *H01L 27/12* (2006.01)
  *H01L 21/84* (2006.01)

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 2011/0117732 A1 | 5/2011 | Bauer et al. |
| 2011/0195555 A1* | 8/2011 | Tsai .................. H01L 21/26526 438/513 |
| 2013/0214357 A1 | 8/2013 | Chang et al. |
| 2014/0035059 A1 | 2/2014 | Giles et al. |
| 2016/0087104 A1 | 3/2016 | Lee et al. |
| 2016/0190137 A1* | 6/2016 | Tsai .................... H01L 29/7851 438/231 |
| 2017/0271462 A1 | 9/2017 | Kim et al. |

\* cited by examiner

METHOD FOR FORMING SEMICONDUCTOR STRUCTURE

CROSS REFERENCE TO RELATED APPLICATIONS

This application is a Divisional application of U.S. patent application Ser. No. 15/652,719, filed on Jul. 18, 2017, the entire of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Despite groundbreaking advances in materials and fabrication, scaling planar devices such as the metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short channel effect, reduced leakage, and higher current flow.

However, since feature sizes continue to decrease, fabrication processes continue to become more difficult to perform. Therefore, it is a challenge to form a reliable semiconductor structure including the FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
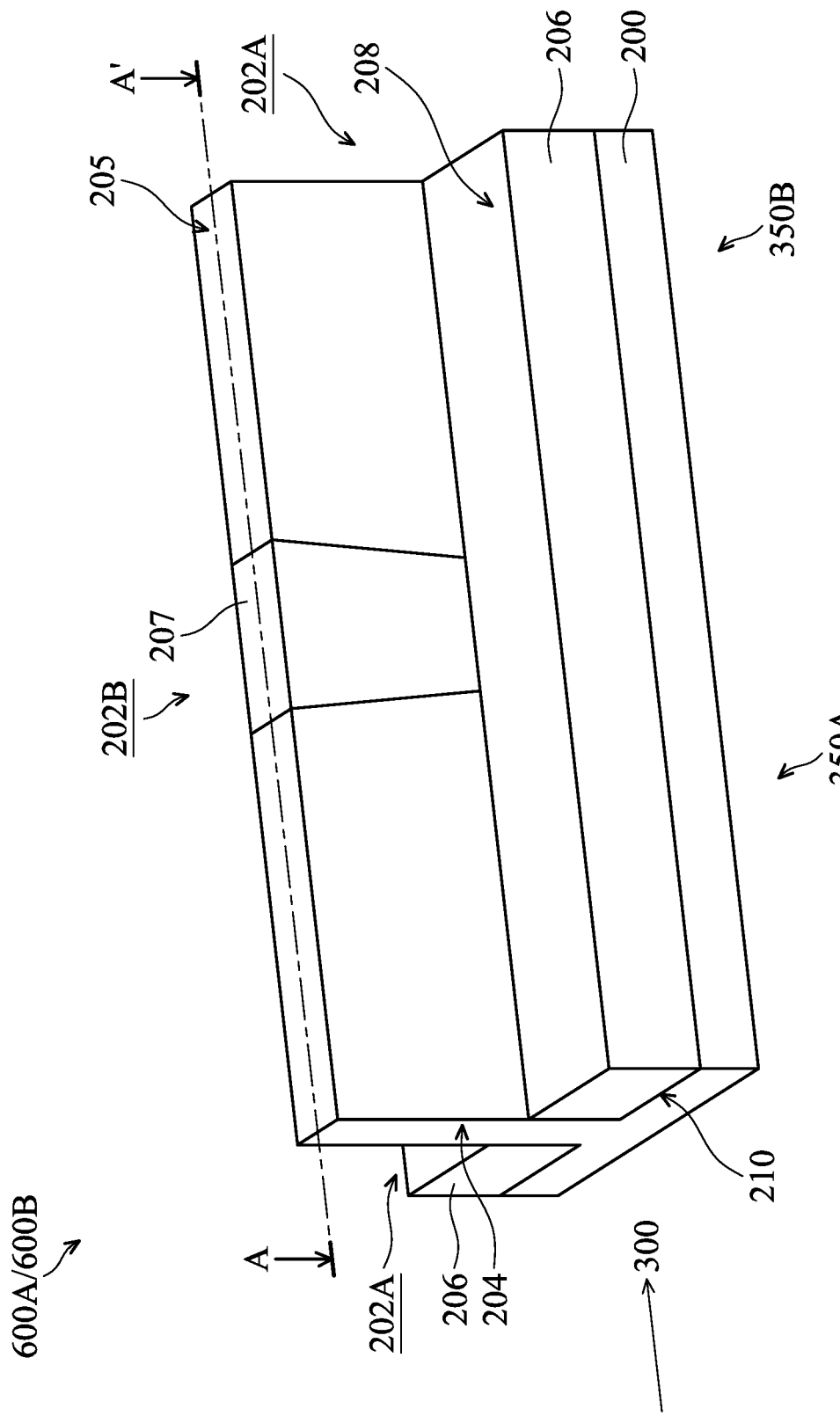
FIGS. 1A-1C are perspective views of various stages of a process for forming a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned by any suitable method. For example, the fins may be patterned using one or more photolithography processes, including double-patterning or multi-patterning processes. Generally, double-patterning or multi patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
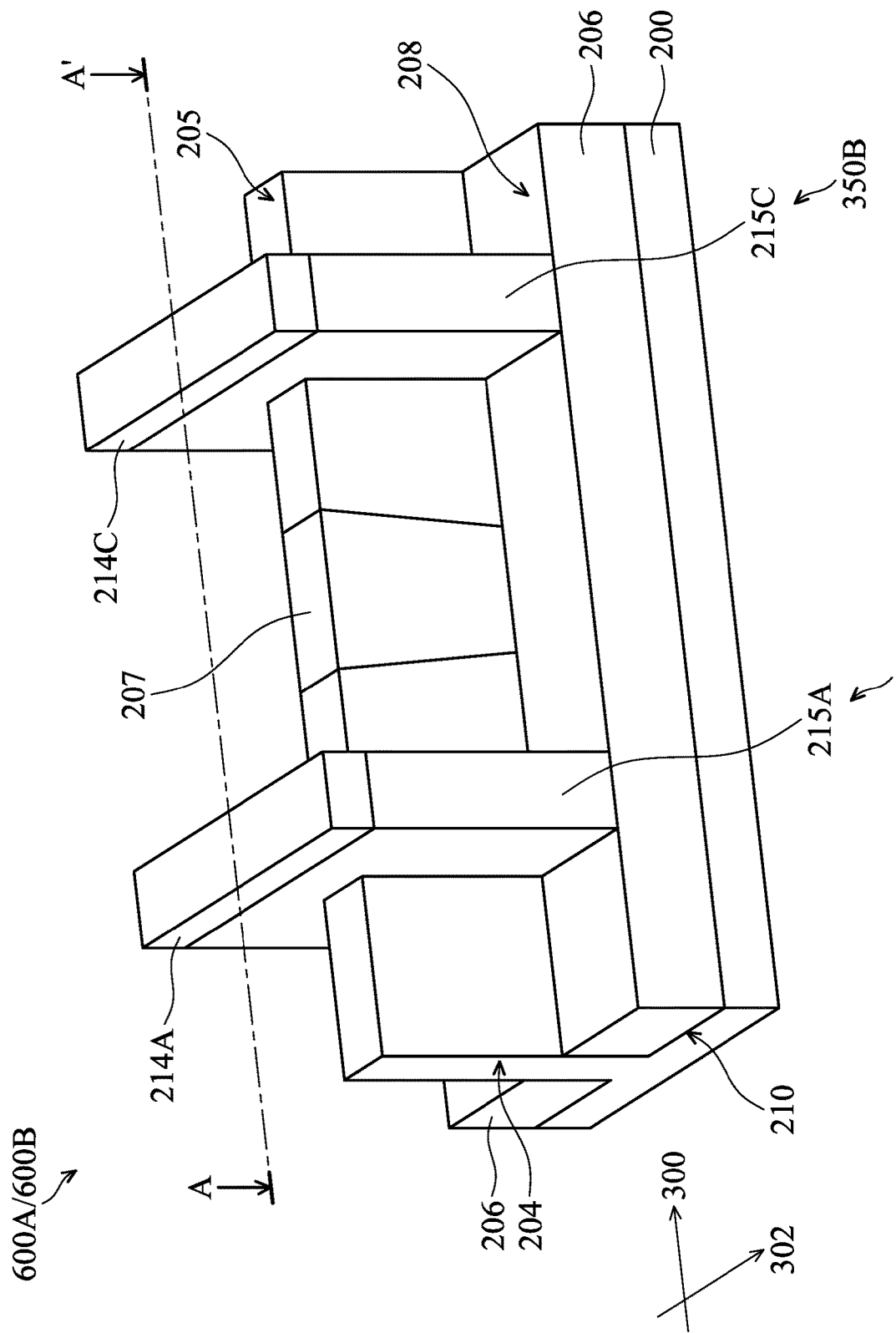
Figure 1C:
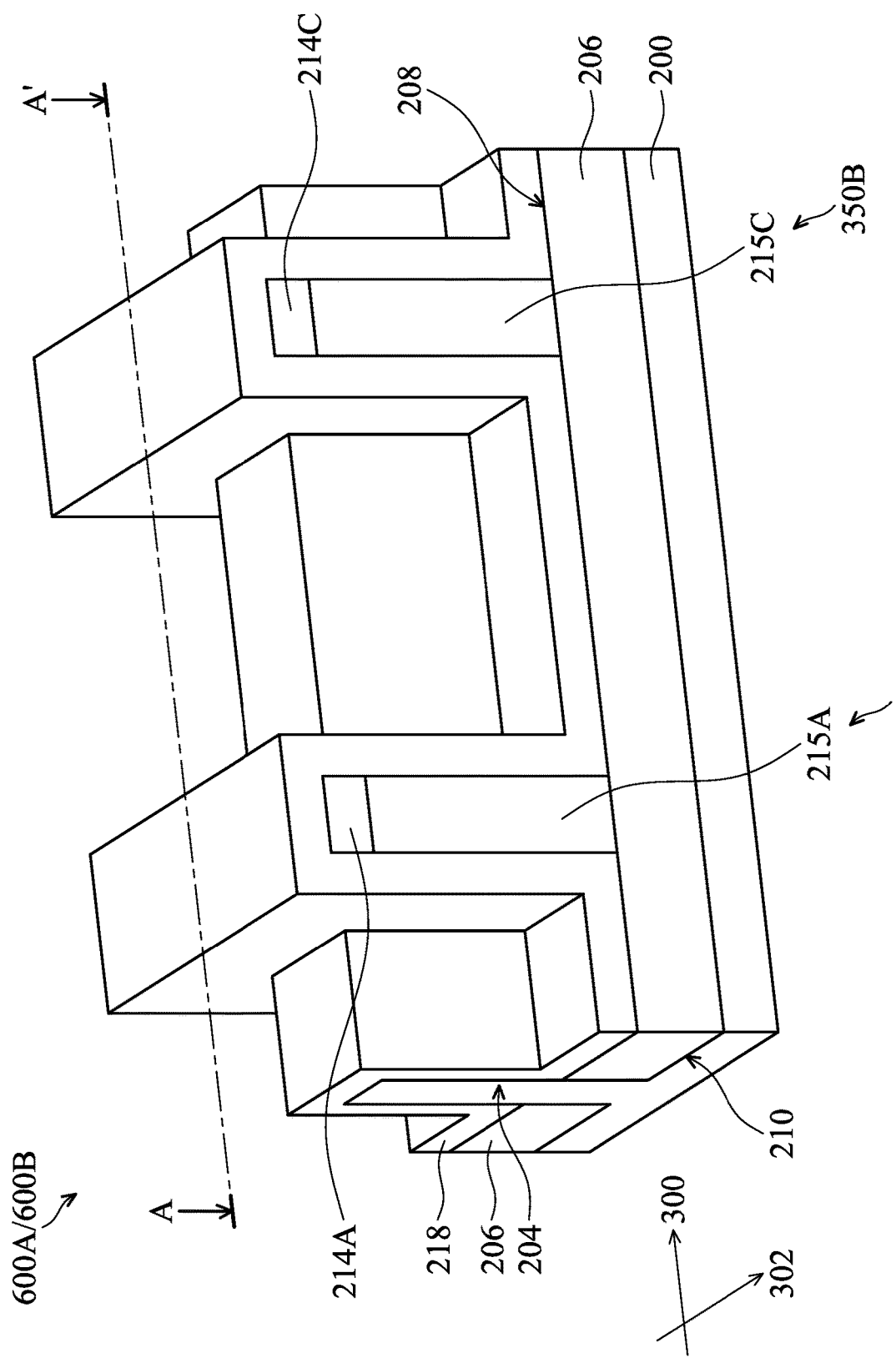
Figure 2A:
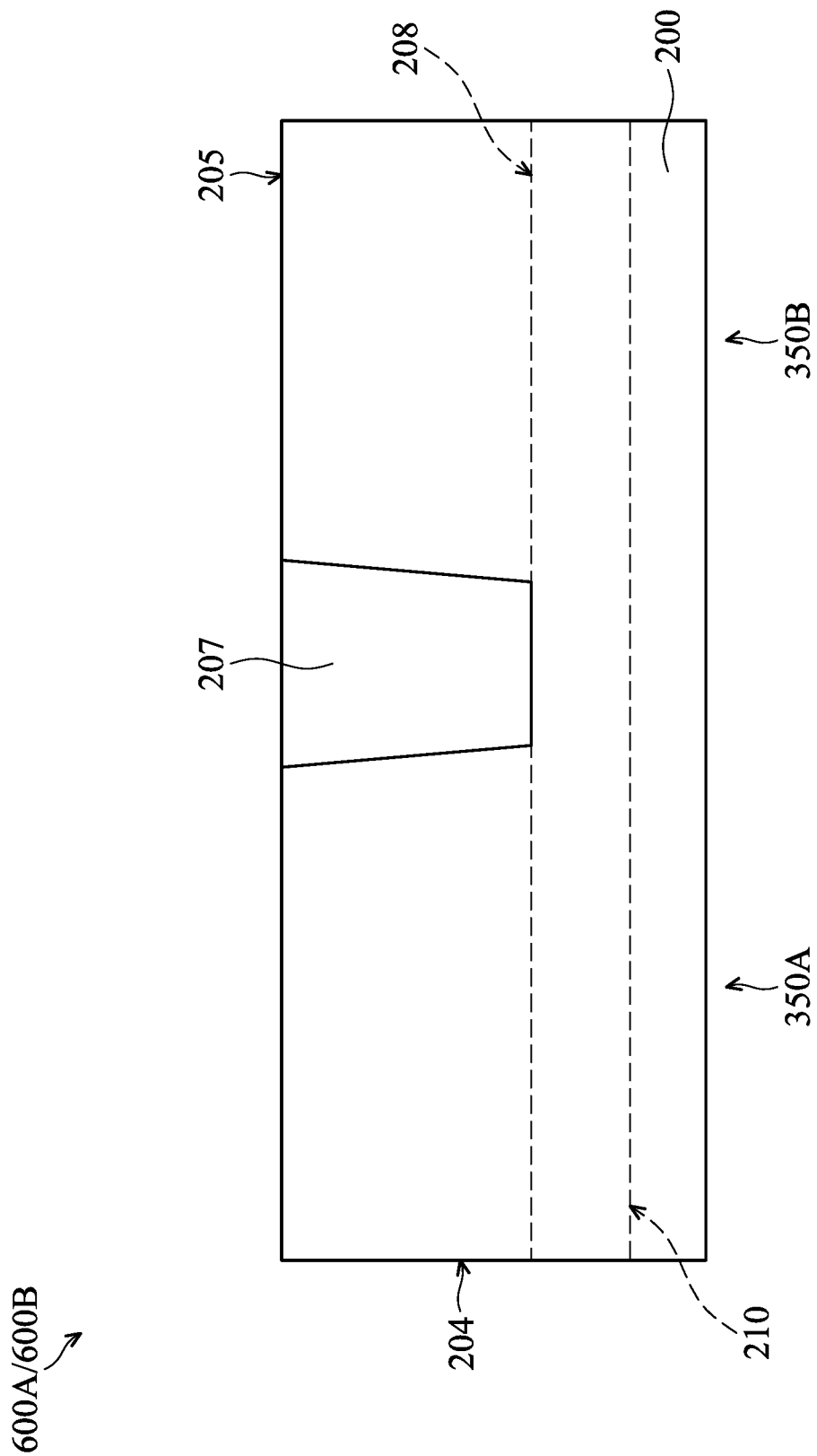
FIGS. 2A-2C are cross-sectional views of various stages of a process for forming a semiconductor structure shown in FIGS. 1A-1C, in accordance with some embodiments.
Figure 2B:
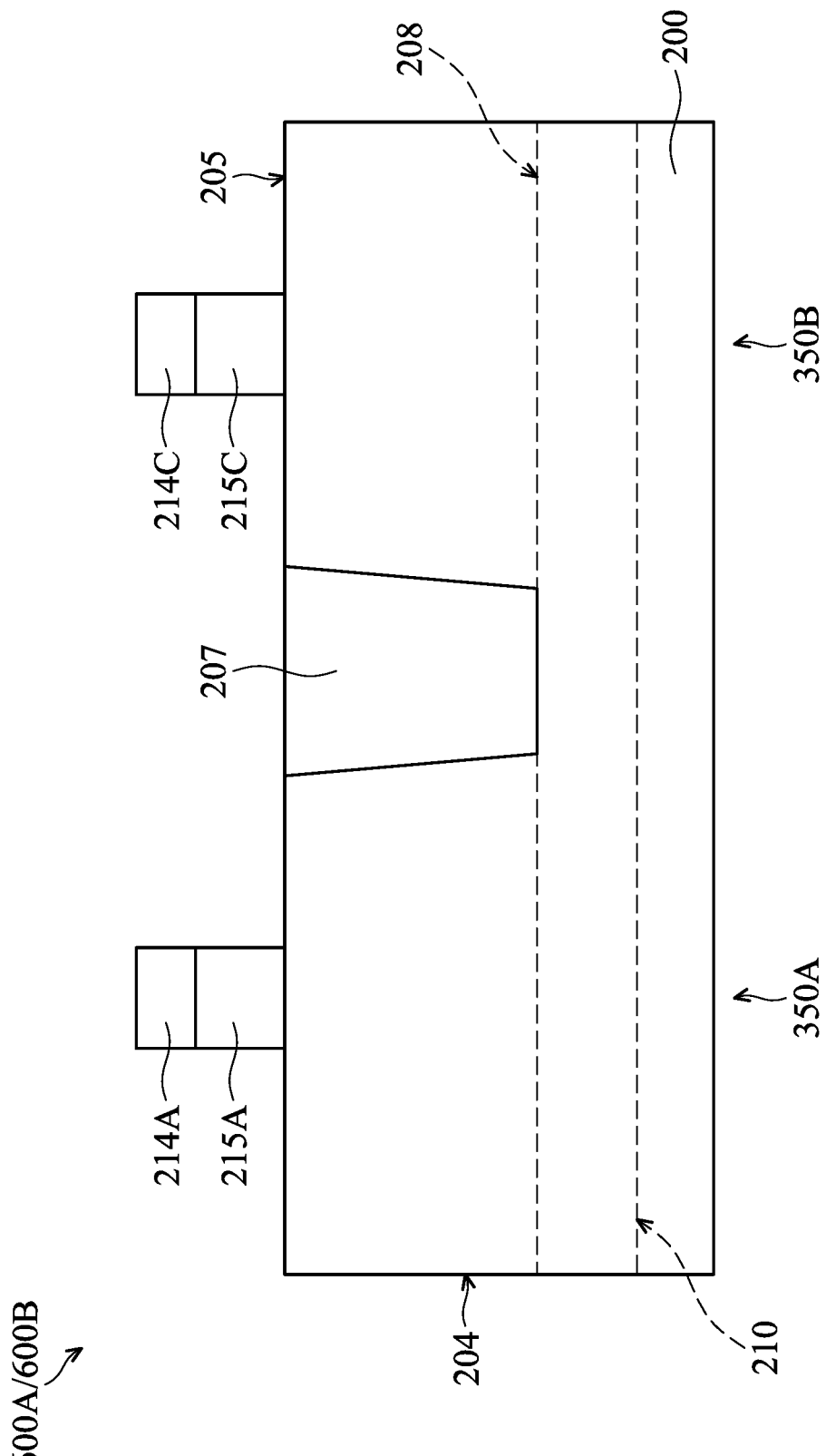
Figure 2C:
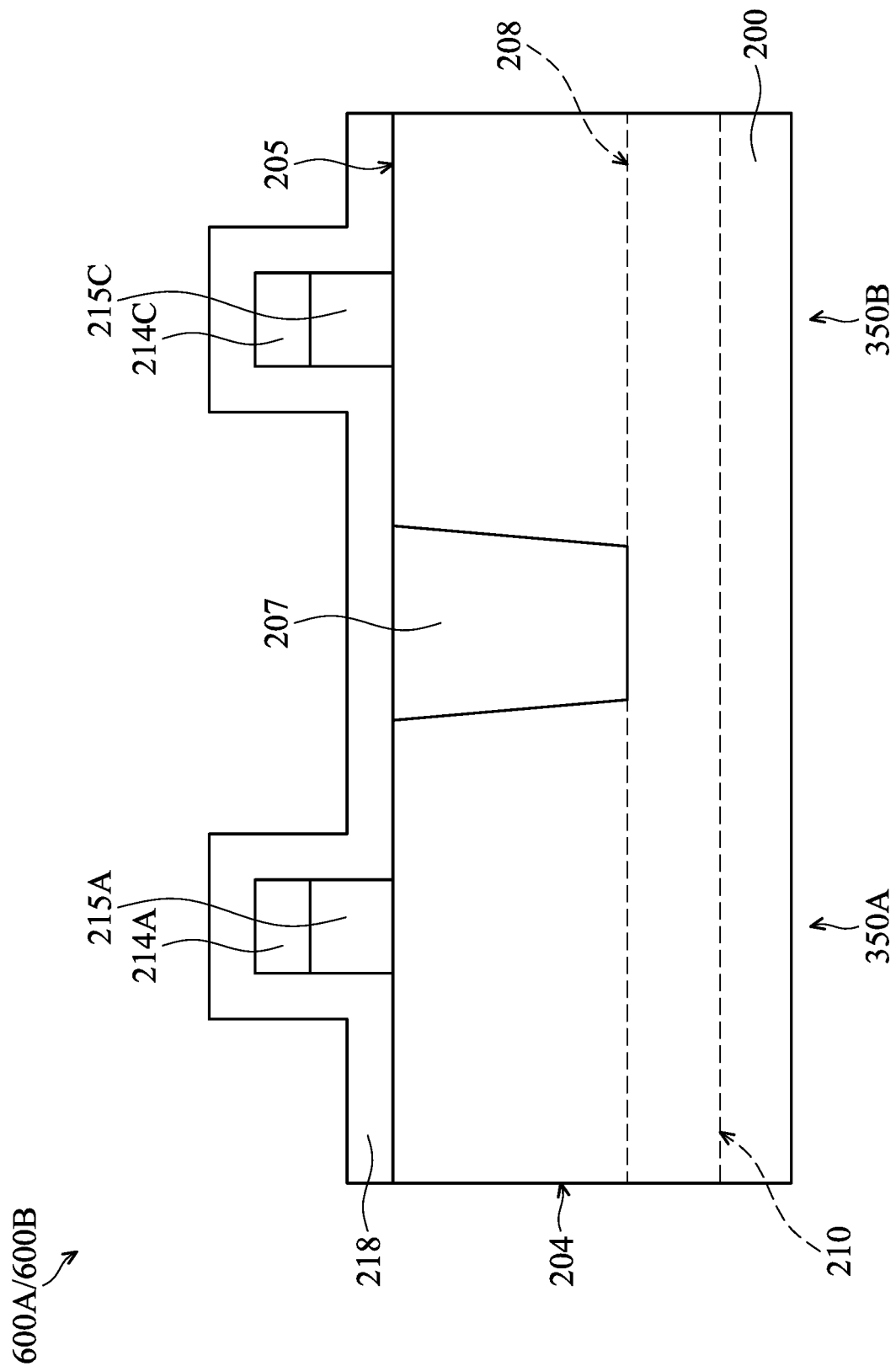

Embodiments of a semiconductor structure and a method for forming the same are provided. FIGS. 1A-1C are perspective views of various stages of a process for forming a semiconductor structure (e.g. the semiconductor structures 600A and 600B), in accordance with some embodiments. FIGS. 2A-2C are cross-sectional views along the line A-A' to show various stages of a process for forming the semiconductor structure 600 shown in FIGS. 1A-1C, in accordance with some embodiments. FIGS. 2D-2M are cross-sectional views of various stages of a process for forming the semiconductor structure 600A after performing the stage shown in FIG. 2C. FIGS. 3A-3J are cross-sectional views of various stages of a process for forming the semiconductor structure 600B after performing the stage shown in FIG. 2C.

In some embodiments, a gate-replacement process is employed to fabricate the semiconductor structure 600A (or 600B), such as a fin field effect transistor (FinFET) (e.g. FinFETs 500A, 500B and 500C).

As shown in FIGS. 1A and 2A, a substrate 200 including a fin structure 204 is received. In some embodiments, the substrate 200 may be a semiconductor substrate, such as a bulk semiconductor, a semiconductor-on-insulator (SOI) substrate, or the like, which may be doped (e.g. with a P-type or an N-type dopant) or undoped. The substrate 50 may be a wafer, such as a silicon wafer. Generally, an SOI substrate includes a layer of a semiconductor material formed on an insulator layer. The insulator layer may b for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 200 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 200 has a first region 350A and a second region 350B. The first region 350A may be for forming N-type devices, such as NMOS transistors, such as N-type FinFETs (e.g. FinFETs 500A and 500B). The second region 350B can be for forming P-type devices, such as PMOS transistors, such as P-type FinFETs (e.g. a FinFET 500C). In some embodiments, the first region 350A and the second region 350B are respectively formed by epitaxially growing different semiconductor materials.

In some embodiments, a mask layer, such as a pad oxide layer (not shown) and an overlying pad nitride layer (not shown), is formed over a top surface 205 of the substrate 200. The pad oxide layer may be a thin film including silicon oxide formed, for example, using a thermal oxidation process. The pad oxide layer may act as an adhesion layer between the substrate 200 and the overlying pad nitride layer and may act as an etch stop layer for etching the pad nitride layer. In some embodiments, the pad nitride layer is formed of silicon nitride, silicon oxynitride, silicon carbide, silicon carbonitride, the like, or a combination thereof, and may be formed using low-pressure chemical vapor deposition (LPCVD) or plasma enhanced chemical vapor deposition (PECVD), as examples.

After forming the mask layer over the top surface 205 of the substrate 200, a patterning process (not shown) may be performed to pattern the mask layer. The patterning process includes a photolithography process and an etching process. The photolithography process includes photoresist coating (e.g. spin-on coating), soft baking, mask aligning, exposure, post-exposure baking, developing the photoresist, rinsing and drying (e.g. hard baking). The etching process may include a dry etching process or a wet etching process. As a result, a patterned mask layer is formed.

After forming the patterned mask layer, an etching process (not shown) is performed on the substrate 200 to form trenches 202A and 202B by removing a portion of the substrate 200 from the top surface 205 of the substrate 200. Therefore, the fin structure 204 is formed along a direction 300 and is positioned between the trenches 202A in the substrate 200. The top surface 205 may serve as a top surface of the fin structure 204. In addition, the trench 202B is formed in the fin structure 204. The etching process may be any acceptable dry etching process, such as a reactive ion etching (RIE), neutral beam etching (NBE), the like, or a combination thereof. The etching process may be anisotropic. The etching process may use a fluorine-based etchant gas, such as $SF_6$, $C_xF_y$, $NF_3$ or a combination thereof. In some embodiments, the trenches 202A may be strips (viewed from in the top) parallel to each other, and closely spaced with respect to each other. In some embodiments, the trenches 202A may be continuous and surround the fin structure 204. After the fin structure 204 is formed, the patterned mask layer may be removed by etching or any other suitable method.

After forming the fin structure 204 and the trenches 202A and 202B, isolation regions 206 and 207 are formed over the substrate 200 and fill the trenches 202A and 202B. The isolation regions 206 and 207 may be formed by a deposition process, a planarization process and a subsequent removal process. The deposition process is performed to deposit an insulation material (not shown) over the substrate 200 and fill the trenches 202A and 202B. In some embodiments, the insulation material is made of a low-k dielectric material including silicon oxide, silicon nitride, silicon oxynitride, fluoride-doped silicate glass (FSG) or a combination thereof. The deposition process may include a chemical vapor deposition (CVD) process, a spin-on-glass process, or another applicable process. The CVD process may include a high density plasma chemical vapor deposition (HDP-CVD), a flowable CVD (FCVD) (e.g. a CVD-based material deposition in a remote plasma system and post curing to convert it to another material, such as an oxide), the like, or a combination thereof. A planarization process, such as a chemical mechanical polishing (CMP) process, may remove any excess insulation material over the top surface (e.g. the top surface 205) of the fin structure 204. Afterwards, a removal process is performed to recess the insulation material in the trenches 202A. Therefore, the isolation regions 206 are formed in the trenches 202A and the isolation region 207 is formed in the trench 202B.

The isolation regions 206 and 207 may be shallow trench isolation (STI) structures surrounding the fin structure 204. A lower portion of the fin structure 204 is surrounded by the isolation structures 206, and an upper portion of the fin structure 204 protrudes from a top surface 208 of each of the isolation structures 206. In other words, a portion of the fin structure 204 is embedded in the isolation structures 206. The isolation regions 206 and 207 may electrically isolate an active region (not shown) of the semiconductor structure 600A (or 600B) from other active regions.

After the isolation regions 206 and 207 are formed, a dummy gate structure 215A is formed over the fin structure 204 in the first region 350A and a dummy gate structure 215C is formed over the fin structure 204 in the second region 350B, as shown in FIGS. 1B and 2B in accordance with some embodiments. A hard mask layer 214A is formed over the dummy gate structure 215A in the first region 350A, and a hard mask layer 214C is formed on the dummy gate structure 215C in the second region 350B. In addition, the dummy gate structures 215A and 215C are formed over the isolation structures 206 and separated from each other by the isolation region 207.

In some embodiments, the dummy gate structures 215A and 215C cover respective channel regions of the resulting finFETs (e.g. FinFETs 500A-500C) fin structure 204 in the first region 350A and in the second region 350B. The dummy gate structures 215A and 215C may extend along a direction 302 and arranged along the direction 300. In addition, the dummy gate structures 215A and 215C are arranged on opposite sides of the isolation region 207. In some embodiments, the direction 302, which is different from the direction 300, is perpendicular to the direction 300.

In some embodiments, the dummy gate structures 215A and 215C cover the top surface 205 and sidewalls of the fin structure 204, and extend over the isolation region 206 and the substrate 200 outside the fin structure 204.

In some embodiments, each of the dummy gate structures 215A and 215C includes a gate dielectric (not shown) and a gate electrode (not shown) formed over the gate dielectric. In some embodiments, the gate dielectric is silicon dioxide. In some embodiments, the silicon dioxide is a thermally grown oxide. In some embodiments, the gate dielectric is a high dielectric constant (high-k) dielectric material. A high-k dielectric material has a dielectric constant (k) higher than that of silicon dioxide. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gate electrode includes polycrystalline-silicon (poly-Si), poly-crystalline silicon-germanium (poly-SiGe), metallic nitride, metallic silicide, metallic oxide, metal, and other suitable layers. In some embodiments, the gate electrode is made of, for example, polysilicon.

In some embodiments, each of the hard mask layers 214A and 214C includes a single layer structure or a multi-layer structure. In some embodiments, the hard mask layers 214A and 214C are made of silicon oxide, silicon nitride, silicon oxynitride, silicon carbide, another suitable material, or a combination thereof.

In some embodiments, the formation of the dummy gate structures 215A and 215C and the hard mask layers 214A and 214C includes a deposition process and a subsequent patterning process. The deposition process is performed to deposit a gate dielectric material layer (not shown), a gate electrode material layer (not shown) and a hard mask material (not shown) in sequence. The patterning process is then performed to partially remove the gate dielectric material layer, the gate electrode material layer and a hard mask material. Therefore, the dummy gate structure 215A and the overlying hard mask layer 214A are formed in the first region 350A and the dummy gate structure 215C and the overlying hard mask layer 214C are formed in the second region 350B. In some embodiments, the deposition process includes a chemical vapor deposition (CVD) process, a physical vapor deposition (PVD) process, an atomic layer deposition (ALD) process, a thermal oxidation process, or another applicable process. In some embodiments, the patterning process includes a photolithography process and a subsequent etching process. In some embodiments, the etching process is a dry etching process.

After the dummy gate structures 215A and 215C and the hard mask layers 214A and 214C are formed, a gate spacer layer 218 is entirely formed over the fin structure 204, the dummy gate structures 215A and 215C and the hard mask layers 214A and 214C in the first region 350A and the second region 350B, as shown in FIGS. 1C and 2C in accordance with some embodiments. In addition, the gate spacer layer 218 is conformally formed over the dummy gate structures 215A and 215C. In some embodiments, the gate spacer layer 218 includes a single layer structure or a multi-layer structure. The gate spacer layer 218 may be made of silicon oxide, silicon nitride, silicon oxynitride, silicon carbide, silicon carbonitride, another suitable material, or a combination thereof. The gate spacer layer 218 may be deposited using a chemical vapor deposition (CVD) process, a physical vapor deposition (PVD) process, a spin-on process, another applicable process, or a combination thereof.

After the gate spacer layer 218 is formed, lightly doped regions (not shown) are formed at opposite sides of each of the dummy gate structures 215A and 215C, in accordance with some embodiments. The lightly doped regions may serve as lightly doped source or lightly doped drain (LDS/LDD) regions of the semiconductor structure 600. Short channel effects may be mitigated by the lightly doped regions. In some embodiments, the lightly doped regions (not shown) are formed by a light ion implantation process and a subsequent annealing process using the dummy gate structures 215A and 215C as an implantation mask. In some other embodiments, one or more additional gate spacer layers (not shown) are formed over the gate spacer layer 218 to increase the distance between the resulting metal gate structure and the drain feature, so that the gate-to-drain capacitance (Cf) of the semiconductor structure is reduced.

FIGS. 2D-2M are cross-sectional views of various stages of a process for forming a semiconductor structure 600A including the after performing the stage of the process for forming a semiconductor structure 600A shown in FIGS. 1C and 2C. In addition, FIGS. 2D-2H illustrate various stages of a process for forming the source/drain features 220A of the FinFET 500A (e.g. the N-type FinFET) in the first region 350A (e.g. the NMOS region) of the semiconductor structure 600A.

Figure 2D:
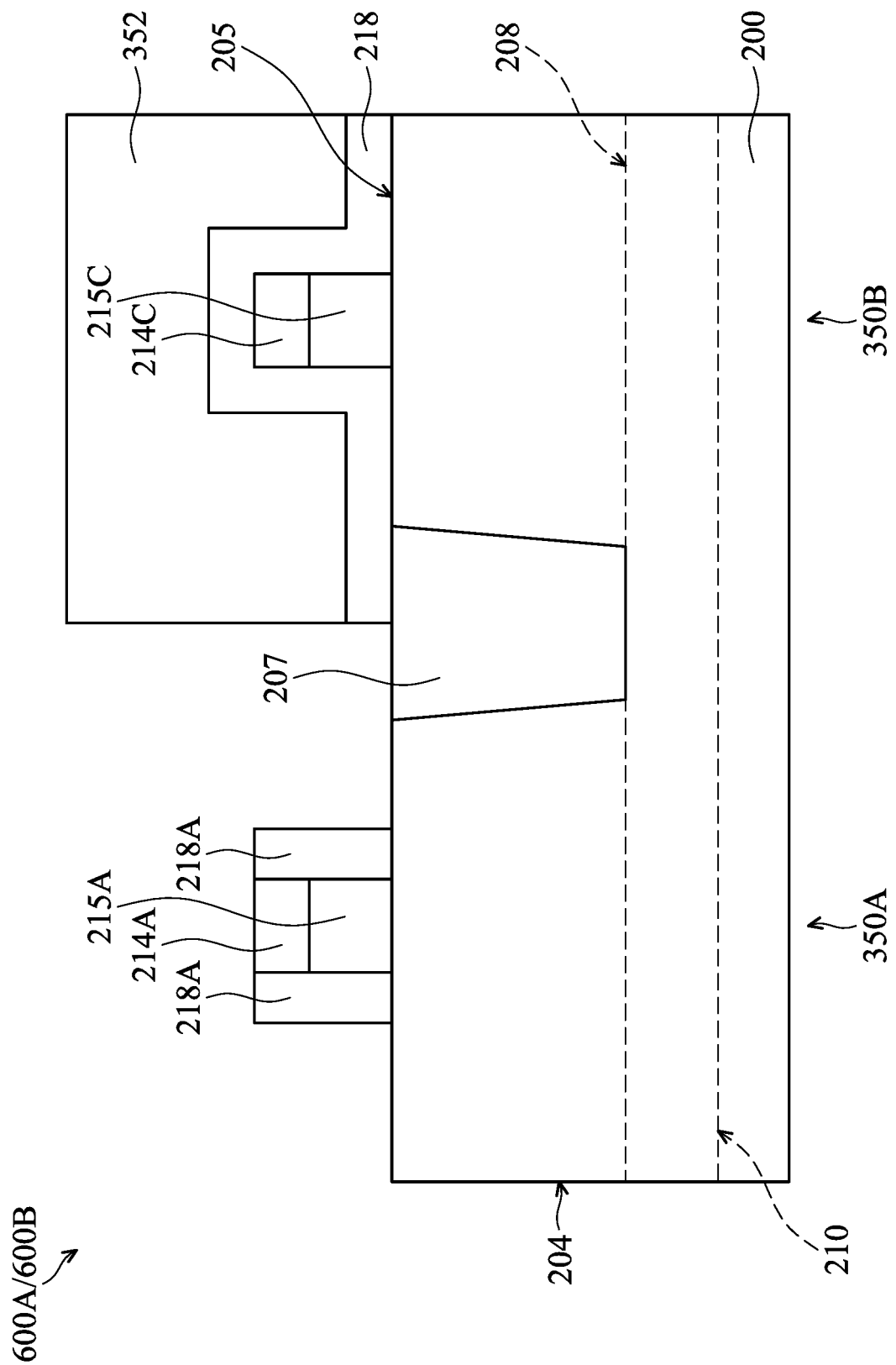
FIGS. 2D-2M are cross-sectional views of various stages of a process for forming a semiconductor structure, in accordance with some embodiments.

After the lightly doped regions (not shown) are formed, a mask layer 352, such as a photoresist (PR), is formed to cover the fin structure 204 in the second region 350B, as shown in FIG. 2D in accordance with some embodiments. In some embodiments, the mask layer 352 is formed by a deposition process and a subsequent photolithography process. The deposition process is performed to form a photoresist material (not shown) over the fin structure 204, the dummy gate structures 215A and 215C and the hard mask layers 214A and 214C, and the isolation regions 206 and 207 in the first region 350A and the second region 350B. Afterwards, the photolithography process is performed to patterned the photoresist material to expose the first region 350A (e.g. an NMOS region) while covering the second region 350B. Therefore, the mask layer 352 is formed. In some embodiments, the deposition process includes a spin-on process. In addition, the photolithography process includes photoresist coating (e.g. spin-on coating), soft baking, mask aligning, exposure, post-exposure baking, developing the photoresist, rinsing and drying (e.g. hard baking).

After the mask layer 352 is formed, the gate spacers 218A are formed on opposite sidewalls of the dummy gate structure 215A and over the fin structure 204, as shown in FIG. 2D in accordance with some embodiments. In some embodiments, the gate spacers 218A are formed by an etching process. The etching process is performed to remove the gate spacer layer 218 until the top surface 205 of the fin structure 204 is exposed. The material of the gate spacers 218A may be silicon oxide, silicon nitride, silicon oxynitride, silicon carbide, silicon carbonitride, another suitable material, or a combination thereof. In some embodiments, the etching process includes a dry etch process.

Figure 2E:
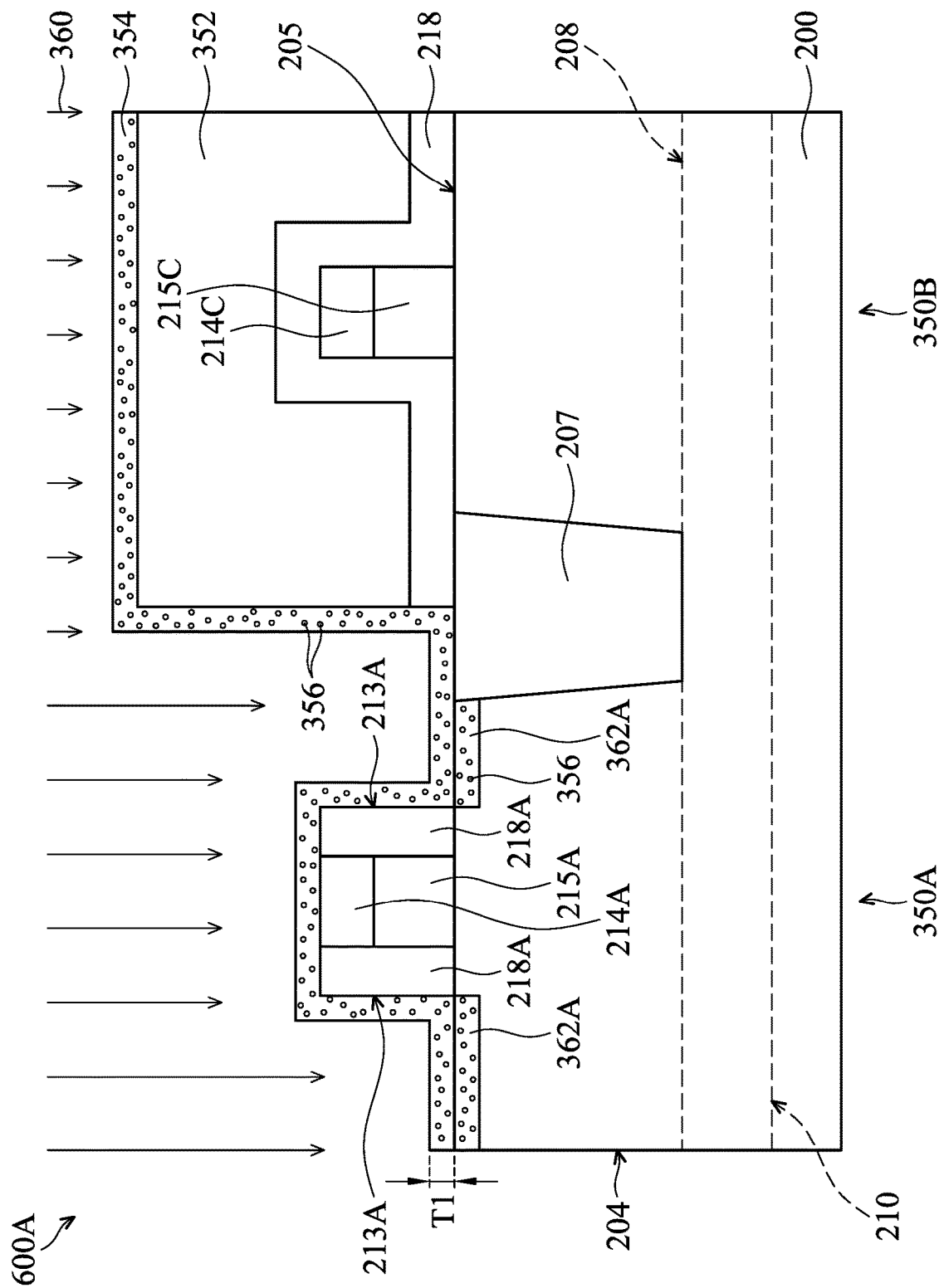

After the gate spacers 218A are formed, a plasma doping process 360 is performed for the first region 350A, as shown in FIG. 2E in accordance with some embodiments. In some embodiments, the plasma doping process 360 includes a deposition process and a knock-on process. In addition, the deposition process and the knock-on process may be in-situ (or simultaneously) performed in the same chamber of a semiconductor processing system. The deposition process of the plasma doping process 360 may be performed to form a dopant source layer 354 over the gate spacers 218A, the hard mask layer 214A and the dummy gate structure 215A in the first region 350A. In addition, the dopant source layer 354 is formed over the top surface 205 of the fin structure 204 that is not covered by the gate spacers 218A, the hard mask layer 214A and the dummy gate structure 215A.

In some embodiments, the dopant source layer 354 includes dopants 356. The dopants 356 may include phosphorus (P), arsenic (As), antimony (Sb) or boron (B). In some embodiments, the deposition process is performed by using a suitable dopant source gases (e.g. an N-type dopant source gases) for the first region 350A (e.g. an NMOS region). For example, the dopant source gases may include the arsine gas ($AsH_3$). The arsine gas ($AsH_3$) can be dissociated into As, AsH and $AsH_2$, which may be deposited on the top surface 205 of the fin structure 204 in the first region 350A. Furthermore, the deposition process may also include a dilution gas, such as argon (Ar), neon (Ne), helium (He), hydrogen (H), krypton (Kr), xenon (Xe), or a combination thereof. In some embodiments, a thickness T1 of the dopant source layer 354 is in a range from about 5 Å to 50 Å.

The knock-on process of the plasma doping process 360 is configured to drive the dopants 356 of the dopant source layer 354 into a portion of the fin structure 204 in the first region 350A (e.g. the NMOS region). The knock-on process may include injecting a knock-on gas in the first region 350A. The knock-on process may be used to uniformly push the dopants 356 of the dopant source layer 354 into the portion of the fin structure 204 from the top surface 205 of the fin structure 204. Therefore, the doped regions 362A including the dopants 356 are formed adjacent to the outer sidewalls 213A of the gate spacers 218A in the first region 350A. The knock-on process is performed by using an inert gas including xenon (Xe), helium (He), argon (Ar), neon (Ne), krypton (Kr), the like, or a combination thereof. In some embodiments, the plasma doping process 360 is performed using a gas source including the N-type dopant (e.g. As) and Xe, with an implantation energy in a range from about 0.1 KeV to about 10 KeV. The dosage of the dopant (e.g. As) may be in a range from about 1E15 atoms/$cm^2$ to about 1E17 atoms/$cm^2$. The gas source (e.g. As and Xe) may be activated into plasma by any suitable method of generating the plasma, such as transformer coupled plasma generator, inductively coupled plasma systems, magnetically enhanced reactive ion etching, electron cyclotron resonance, a remote plasma generator, or the like.

After the plasma doping process 360 is performed, the doped regions 362A are formed extending from the top surface 205 of the fin structure 204 into a portion of the fin structure 204. In addition, the doped regions 362A are formed outside the outer sidewalls 213A of the gate spacers 218A in the first region 350A. The concentration of the dopants 356 in the doped regions 362A may be in a range from about 1E19 atoms/$cm^3$ to about 1E21 atoms/$cm^3$.

After the doped regions 362A are formed, the dopant source layer 354 is removed from the first region 350A using a wet etching process or other suitable method. In some embodiments, a wet etching process is performed using sulfuric peroxide mixture (SPM), which is an acid including $H_2SO_4$ and $H_2O_2$. The SPM has an etch selectivity between the dopant source layer 354 and the gate spacers 218A and between the dopant source layer 354 and the hard mask layer 214A. Therefore, the SPM may remove dopant source layer 354 without substantially attacking the gate spacers 218A and the hard mask layer 214A. In some embodiments, the wet etching process conditions (e.g. time, temperature) are controlled such that the wet etching process removes the dopant source layer 354 without substantially removing the dopants 356 in the doped regions 362A (and embedded in the gate spacers 218A) in the first region 350A. In some embodiments, the wet etching process is performed for a time interval in a range from about 15 seconds to about 180 seconds, such as 45 seconds, using a high temperature SPM solution at a temperature from about 80° C. to about 200° C.

Figure 2F:
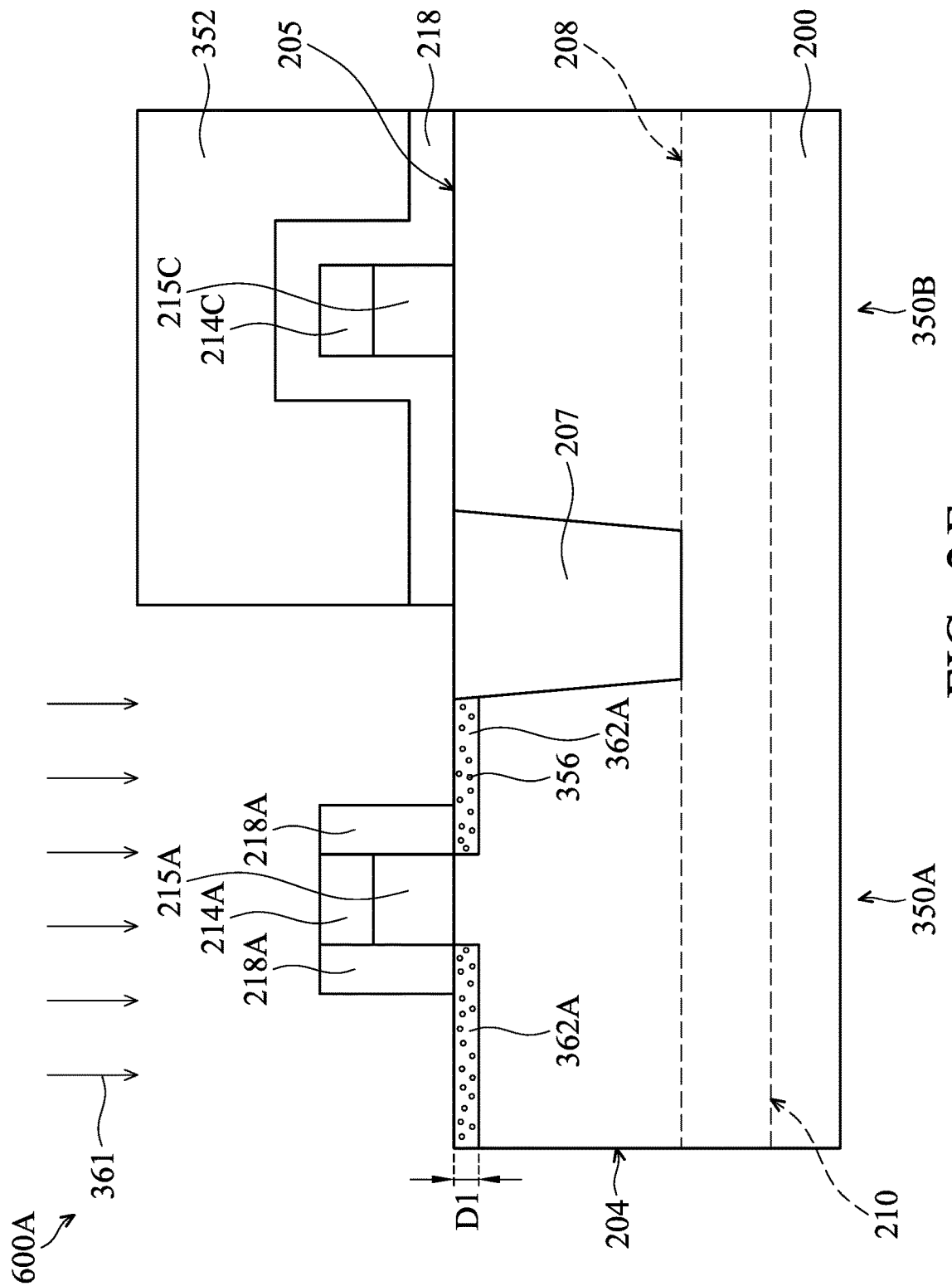

After the dopant source layer 354 is removed, an annealing process 361 is performed to diffuse the dopants 356 in the fin structure 204, so that the diffused doped region 362A is formed in a portion of the fin structure 204, as shown in FIG. 2F in accordance with some embodiments. In some embodiments, the diffused doped region 362A is laterally (along the direction 300) diffused under the gate spacers 218A. In other words, the diffused doped region 362A overlaps the gate spacers 218A. The diffused doped region 362A may have a depth D1 in a range from about 0.1 nm to 10 nm. The depth D1 is along a direction perpendicular to the top surface 205 of the fin structure 204. In some embodiments, the annealing process 361 may be performed in the same chamber as the plasma doping process 360. In some embodiments, the annealing process may be performed in a chamber different from the chamber used in the plasma doping process 360. The annealing process 361 may activate the dopants 356 (e.g. the N-type dopant) in the doped regions 362A. In addition, the annealing process 361 may drive the dopants 356 (e.g. the N-type dopants) embedded in the gate spacers 218A into the fin structure 204 in the first region 350A. In some embodiments, the annealing process 361 is a spike annealing process performed at a temperature in a range from about 1000° C. to about 1050° C., such as 1045° C., for a time interval in a range from about 1 second to about 2 seconds, and in a ambient including $O_2$.

The high temperature (e.g. 1045° C.) of the annealing process 361 helps to drive the dopants 356 into the corresponding fin structure 204, however, such a high temperature also increases the outgassing of the dopants 362A (e.g. As). Outgassing of the dopants 362A results in lower concentration of the dopant in the LDD region to be formed in the fin structure 204 in the first region 350A. Outgassing may also pose a safety issue for the production tool. The $O_2$ in the ambient gas may reduce outgassing of the dopant. For example, if dopant 362A is As, $O_2$ reacts (e.g. oxidizes) with the As at the surface of the fin structure 204 in the first region 350A and forms an oxide film (e.g. an oxide of As, not shown individually) over the fin structure 204. This oxide film serves to prevent or reduce outgassing of As during the annealing process 361. In some embodiments, the annealing process 361 (e.g. the spike annealing process) is performed in a gas environment including about 2% to about 3% of $O_2$ and about 97% to about 98% of $N_2$.

Figure 2G:
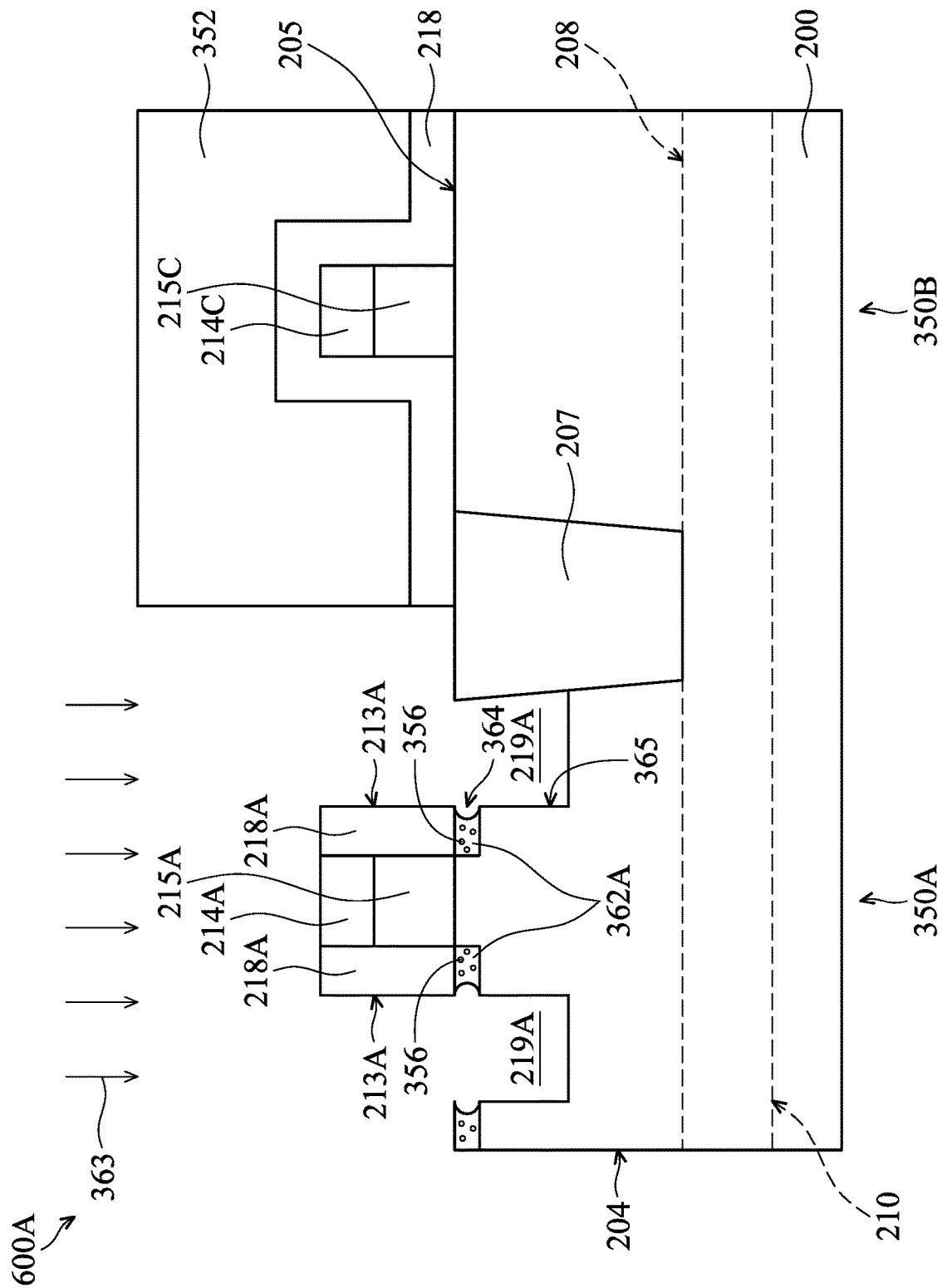

After the diffused doped region 362A is formed, an etching process 363 is performed to remove the doped region 362A and the underlying fin structure 204 in the first region 350A and not covered by the dummy gate structure 215A and the gate spacers 218A, as shown in FIG. 2G in accordance with some embodiments. The etching process 363 is performed to form recesses 219A adjacent the gate spacers 218A and in the fin structure 204 in the first region 350A. The recesses 219A are configured to provide positions of a source/drain features formed in the subsequent processes.

In some embodiments, the etching process 363 has a first etching rate during the removal of the doped region 362A including the dopants 356 in the first region 350A of the fin structure 204 and has a second etching rate during the removal of the fin structure 204 underlying the doped region 362A. The dopants 356 (e.g. the N-type dopants) in the doped region 362A may increase the etching rate due to the higher electron density caused by coulomb attraction. Therefore, the first etching rate may be different from the second etching rate. For example, the first etching rate is faster than the second etching rate. In some embodiments, the etching process 363 is a dry etching process. In some embodiments, etching gases used in the etching process 363 include HBr, NF3, $O_2$ and other suitable etching gases.

In some embodiments, each of the recesses 219A has an upper sidewall portion 364 adjacent to the top surface 205 of the fin structure 204 and a lower sidewall portion 365 below the upper sidewall portion 364. The upper sidewall portion 364 and the lower sidewall portion 365 of each of the recesses 219A may be close to the channel region of the semiconductor structure 600A. The upper sidewall portion 364 is adjacent to and is surrounded by the doped region 362A. In addition, the lower sidewall portion 365 is adjacent to the upper sidewall portion 364. Moreover, the lower sidewall portion 365 is positioned outside and below the doped region 362A. In some embodiments, the upper sidewall portion 364 of each of the recesses 219A is positioned directly below the corresponding gate spacer 218A, and the lower sidewall portion 365 is aligned the outer sidewall 213A of the corresponding gate spacer 218A.

In some embodiments, the upper sidewall portion 364 and the lower sidewall portion 365 of each of the recesses 219A have different profiles in the cross-sectional view (FIG. 2G) along the longitudinal direction of the fin structure 204 (e.g. the direction 300). For example, the upper sidewall portion 364 may be a rounded (curved) and concave sidewall portion, and the lower sidewall portion 365 may be a substantially straight sidewall portion. The curvature of the upper sidewall portion 364 may be different from that of the lower sidewall portion 365. Therefore, the upper sidewall portion 364 and the lower sidewall portion 365 may collectively form a bent sidewall of each of the recesses 219A. The bent sidewall is positioned adjacent to the channel region and the corresponding gate spacer 218A of the semiconductor structure 600A.

Figure 2H:
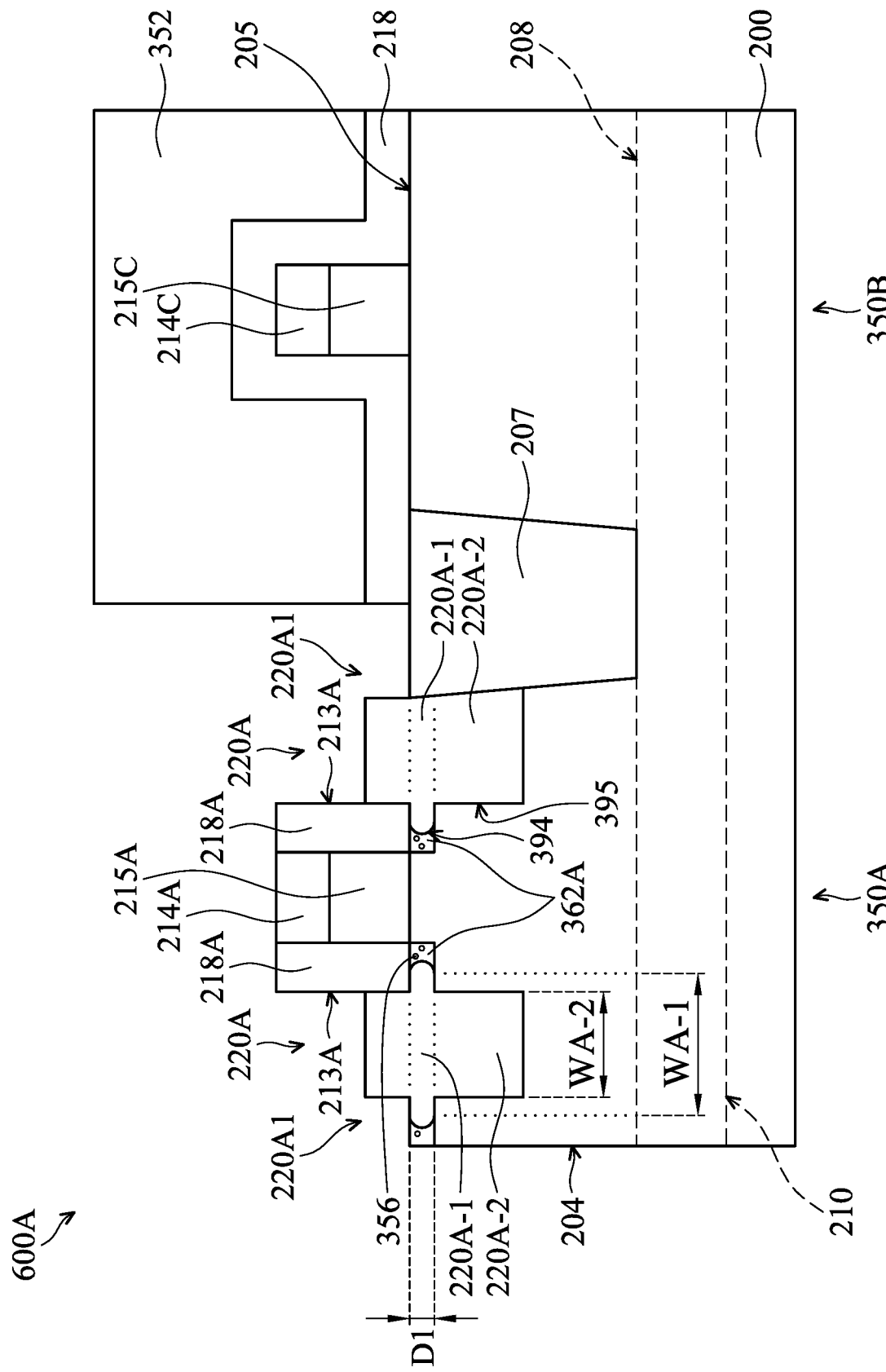
Figure 2:
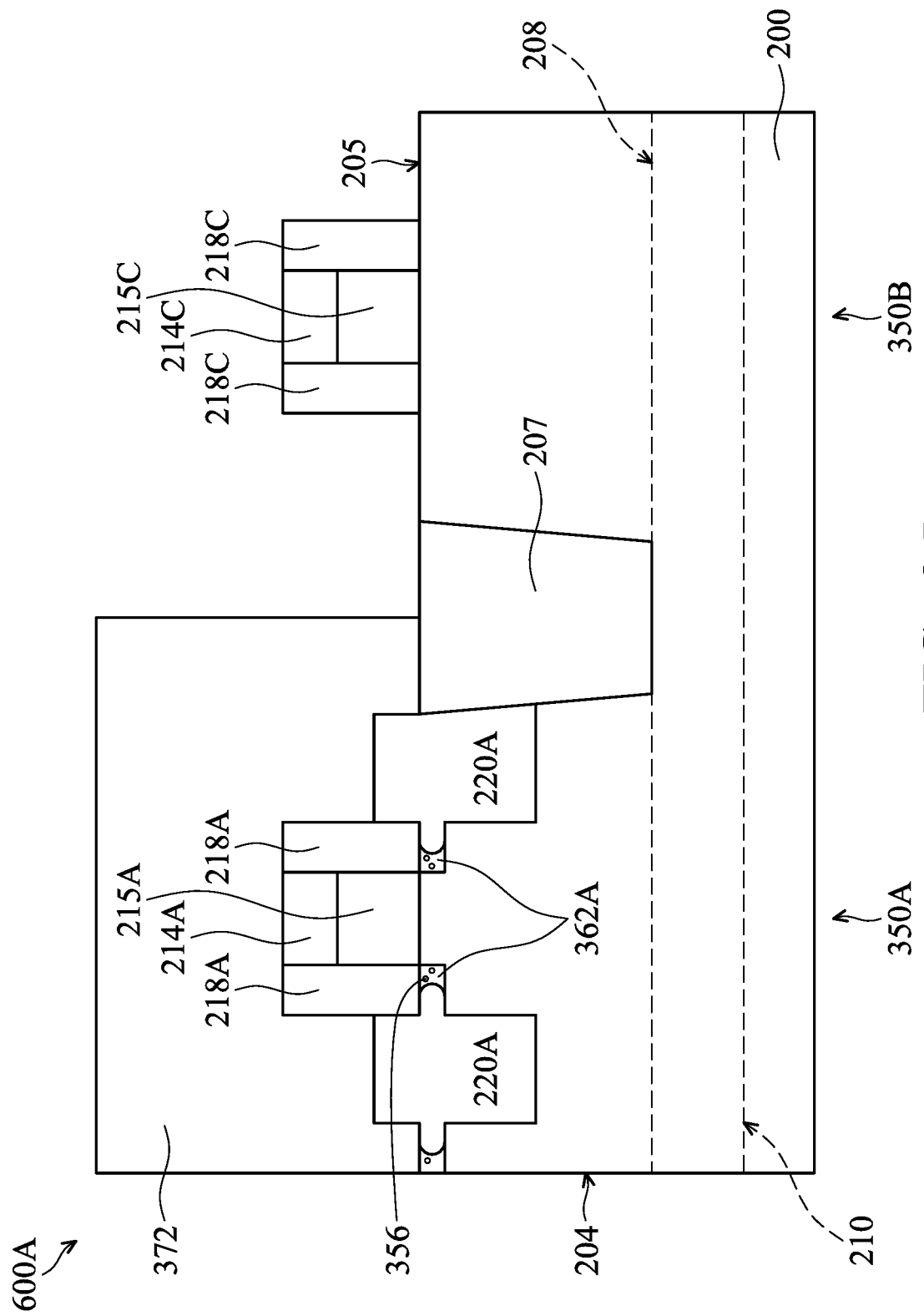
Figure 2:
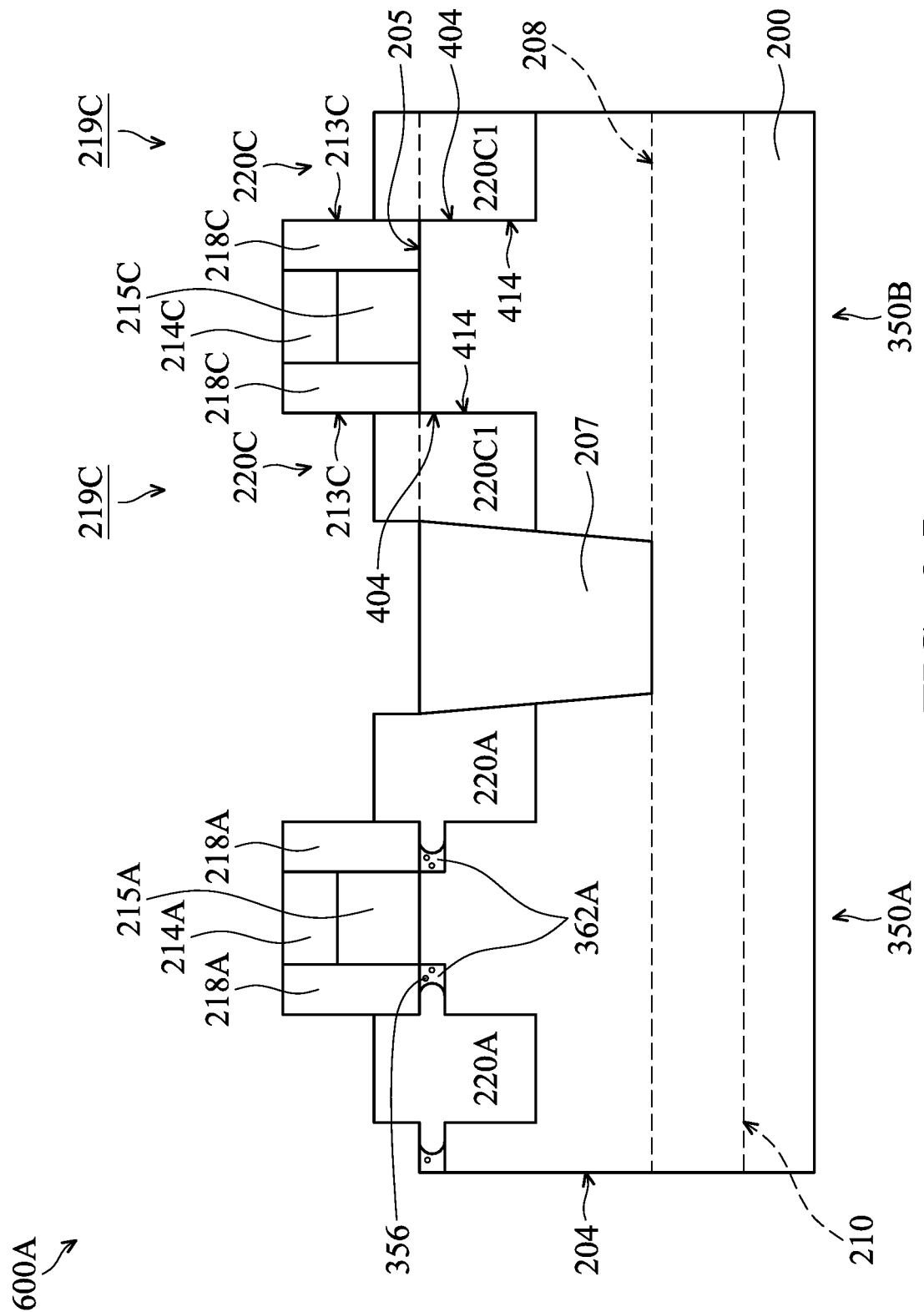

After the recesses 219A is formed in the fin structure 204 in the first region 350A, source/drain features 220A are formed in the recesses 219A in the first region 350A of the fin structure 204, as shown in FIG. 2H in accordance with some embodiments. In some embodiments, the filling process (not shown) is performed by filling the recesses 219A with one or more strained semiconductor materials to form the source/drain features 220A.

In some embodiments, the source/drain features 220A are formed adjacent to or next to the lightly doped regions (not shown) close to the dummy gate structure 215A. The source/drain features 220A are respectively formed on the opposites of the dummy gate structure 215A. In some embodiments, each of the source/drain features 220A has a portion 220A1 embedded in the fin structure 204 (and below the top surface 205 of the fin structure 204. The portion 220A1 of each of the source/drain features 220A may have an upper sidewall portion 394 and a lower sidewall portion 395. The upper sidewall portion 394 of the portion 220A1 may be adjacent to the top surface 205 of the fin structure 204 and close to the channel region of the semiconductor structure 600A. In addition, the upper sidewall portion 394 of the portion 220A1 may be surrounded by the doped region 362A. The lower sidewall portion 395 of the portion 220A1 may be positioned below the upper sidewall portion 394.

In some embodiments, the upper sidewall portion 394 of the portion 220A1 has a rounded (curved) and convex profile, and the lower sidewall portion 395 of the portion 220A1 has a straight profile shown in FIG. 2H. Therefore, a first curve radius of the upper sidewall portion 394 of the portion 220A1 is different from a second curve radius of the lower sidewall portion 395 of the portion 220A1 in the cross-sectional view (FIG. 2H) along the longitudinal direction of the fin structure 204 (e.g. the direction 300). In addition, the first curve radius of the upper sidewall portion 394 is less than the second curve radius of the lower sidewall portion 395 of the portion 220A1 of the source/drain feature 220A in the first region 350A. For example, the first curve radius of the upper sidewall portion 394 has a positive value, and the second curve radius of the lower sidewall portion 395 has an infinite value. In other words, the absolute value of the first curve radius of the upper sidewall portion 394 is less than the absolute value of the second curve radius of the lower sidewall portion 395 of the portion 220A1 of the source/drain feature 220A in the first region 350A. Moreover, the curvature of the upper sidewall portion 394 is different from that of the lower sidewall portion 395. For example, the curvature of the upper sidewall portion 394 is greater than the curvature of the lower sidewall portion 395.

In some embodiments, the portion 220A1 of each of the source/drain features 220A in the first region 350A includes an upper portion 220A-1 and a lower portion 220A-2. The upper portion 220A-1 is positioned close to the top surface 205 of the fin structure 204 and overlapping the corresponding gate spacer 218A. In addition, the lower portion 220A-2 is positioned below the upper portion 220A-1. The upper portion 220A-1 of the portion 220A1 of each of the source/drain features 220A in the first region 350A has a convex edge (i.e. the upper sidewall portion 394). The lower portion 220A-2 of the portion 220A1 of each of the source/drain features 220A in the first region 350A has a straight edge (i.e. the lower sidewall portion 395).

In some embodiments, the upper portion 220A-1 of the portion 220A1 of each of the source/drain features 220A surrounded by the by the doped region 362A has a depth that is the same to the depth D1 of the diffused doped region 362A. In addition, the depth of the upper portion 220A-1 (e.g. the depth DO may be in a range from about 0.1 nm to 10 nm. Furthermore, the width WA-1 of the first upper portion 220A-1 is larger than the width WA-2 of the first lower portion 220A-2. In some embodiments, a top of each of the source/drain features 220A is higher than the top surface 205 of the fin structure 204.

In some embodiments, the plasma doping process 360 is performed to form the doped region 362A having a shallow depth (e.g. the depth D1 in a range from about 0.1 nm to 10 nm) and a heavy concentration of N-type dopants (e.g. in a range from about 1E19 atoms/cm$^3$ to about 1E21 atoms/cm$^3$), the upper portion 220A-1 of the portion 220A1 of each of the source/drain features 220A is formed laterally extending toward the channel region of the semiconductor structure 600A in the first region 350A (e.g. the NMOS region), the carrier mobility and the device performance of the semiconductor structure 600A can be improved by adjusting the proximity of the embedded portion (the upper portion 220A-1 of the portion 220A1) of the source/drain features 220A (i.e. the distance between the upper portion 220A-1 of the portion 220A1 and the channel region of the resulting finFET of the semiconductor).

In some embodiments, the source/drain features 220A may include a strain material to apply stress to the channel region. For example, the source/drain features 220A are formed of Ge, SiGe, InAs, InGaAs, InSb, GaAs, GaSb, InAlP, InP, or the like. In some embodiments, the lattice constant of the source/drain features 220A are different from the lattice constant of the fin structure 204. In some embodiments, the source/drain features 220A have a diamond shape.

In some embodiments, the filling process includes an epitaxial process, such as a selective epitaxial growth (SEG) process, CVD deposition techniques (e.g. vapor-phase epitaxy (VPE) and/or ultra-high vacuum CVD (UHV-CVD)), molecular beam epitaxy, or another suitable epitaxial process. After the source/drain features 220A are formed in the fin structure 204 in the first region 350A, the mask layer 352 is removed.

After the source/drain features 220A are formed, a mask layer 372, such as a photoresist (PR), is formed to cover the fin structure 204 in the first region 350A, as shown in FIG. 2I in accordance with some embodiments. In some embodiments, the mask layer 372 is formed by a deposition process and a subsequent photolithography process. The deposition process is performed to form a photoresist material (not shown) over the fin structure 204, the dummy gate structures 215A and 215C and the hard mask layers 214A and 214C, the source/drain features 220A and the isolation regions 206 and 207 in the first region 350A and the second region 350B. Afterwards, the photolithography process is performed to patterned the photoresist material to expose the second region 350B (e.g. a PMOS region) while covering the first region 350A. Therefore, the mask layer 372 is formed. In some embodiments, the deposition process includes a spin-on process. In addition, the photolithography process includes photoresist coating (e.g. spin-on coating), soft baking, mask aligning, exposure, post-exposure baking, developing the photoresist, rinsing and drying (e.g. hard baking).

After the mask layer 372 is formed, the gate spacers 218C are formed on opposite sidewalls of the dummy gate structure 215C and over the fin structure 204, as shown in FIG. 2I in accordance with some embodiments. In some embodiments, the gate spacers 218C are formed by an etching process. The etching process is performed to remove the gate spacer layer 218 until the top surface 205 of the fin structure 204 in the second region 350B is exposed. The material of the gate spacers 218C may be silicon oxide, silicon nitride, silicon oxynitride, silicon carbide, silicon carbonitride, another suitable material, or a combination thereof. In some embodiments, the etching process includes a dry etch process.

After the gate spacers 218C are is formed, an etching process (not shown) is performed to remove the fin structure 204 in the second region 350B and not covered by the dummy gate structure 215C and the gate spacers 218C, as shown in FIG. 2J in accordance with some embodiments. Therefore, recesses 219C are formed adjacent the gate spacers 218C and in the fin structure 204 in the second region 350B. The recesses 219C are configured to provide positions of a source/drain features formed in the subsequent processes.

In some embodiments, each of the recesses 219C has a sidewall portion 404 substantially aligned to the outer sidewall 213C of the corresponding gate spacer 218C. The sidewall portion 404 may have a continuous and straight profile shown in FIG. 2J. In other words, the upper sidewall portion (close to the top surface 205 of the fin structure 204) and the lower sidewall portion (below the upper sidewall portion) of each of the recesses 219C have the same profiles in the cross-sectional view (FIG. 2J) along the longitudinal direction of the fin structure 204 (e.g. the direction 300). The profile of the sidewall portion 404 may extend substantially along the direction perpendicular to the top surface 205 of the fin structure 204.

After the recesses 219C is formed in the fin structure 204 in the second region 350B, source/drain features 220C are formed in the recesses 219C in the second region 350B of the fin structure 204, as shown in FIG. 2J in accordance with some embodiments. In some embodiments, the fill ng process (not shown) is performed by filling the recesses 219C with one or more strained semiconductor materials to form the source/drain features 220C.

In some embodiments, the source/drain features 220C are formed adjacent to or next to the lightly doped regions (not shown) close to the dummy gate structure 215C. The source/drain features 220C are respectively formed on the opposites of the dummy gate structure 215C. In some embodiments, each of the source/drain features 220C has a portion 220C1 embedded in the fin structure 204 (and below the top surface 205 of the fin structure 204. The portion 220C1 may have a sidewall portion 414. In some embodiments, the sidewall portion. 414 of the portion 220C1 substantially aligned to the outer sidewall 213C of the corresponding gate spacer 218C. The sidewall portion 414 may have a continuous and straight profile shown in FIG. 2J. In other words, the upper sidewall portion (close to the top surface 205 of the fin structure 204) and the lower sidewall portion (below the upper sidewall portion) of the portion 220A1 have the same profiles in the cross-sectional view (FIG. 2J) along the longitudinal direction of the fin structure 204 (e.g. the direction 300). The profile of the sidewall portion 414 may extend substantially along the direction perpendicular to the top surface 205 of the fin structure 204.

Figure 2K:
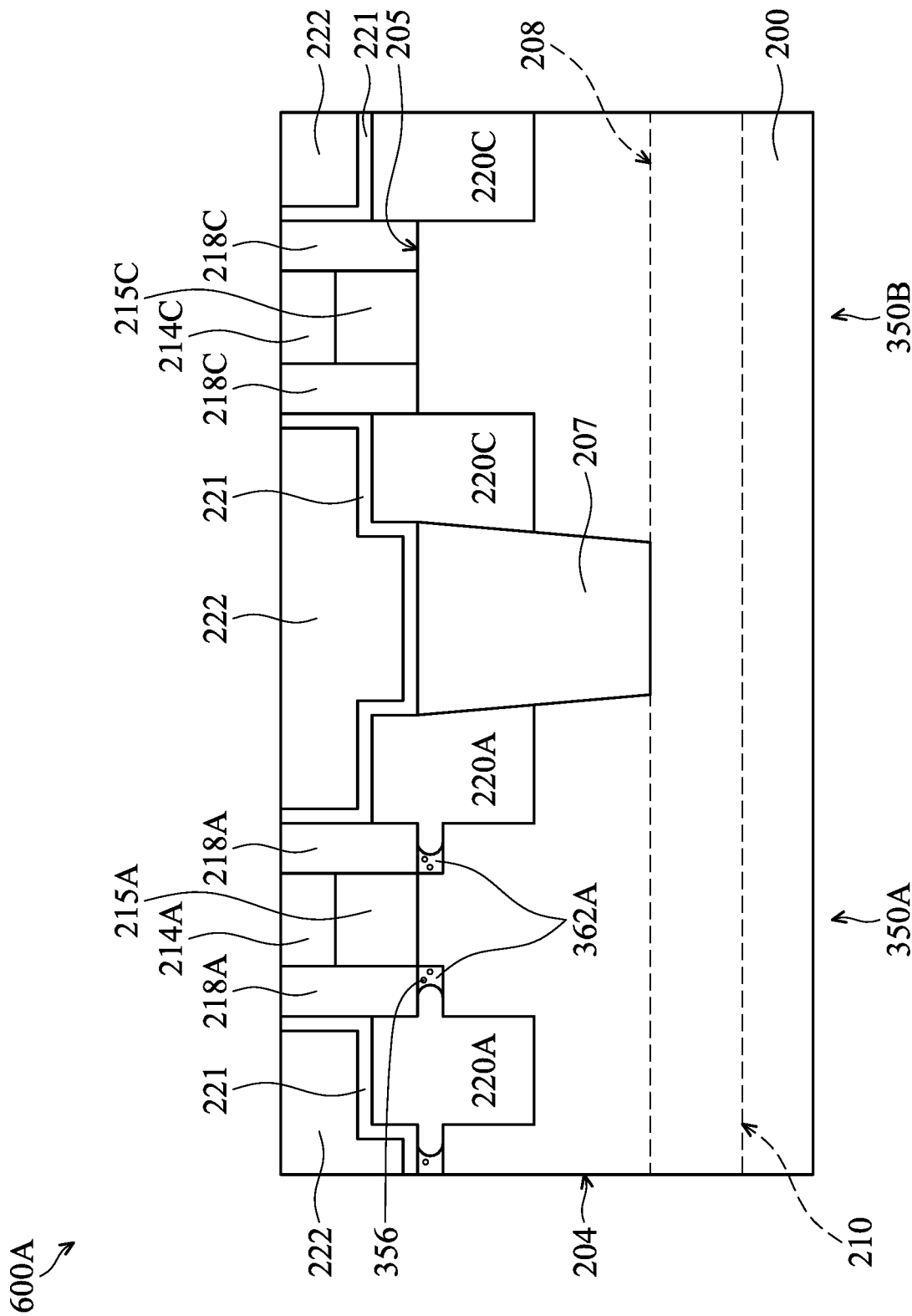

After the source/drain features 220C are formed, a contact etch stop layer (CESL) 221 and an inter-layer dielectric (ILD) layer 222 are formed over the fin structure 204, the source/drain features 220A and 220C, and the dummy gate structures 215A and 215C, as shown in FIG. 2K in accordance with some embodiments. The CESL 221 may be conformally formed on the outer sidewalls 213A of the dummy gate structure 215A and the outer sidewalls 213C of the dummy gate structure 215C, The ILD layer 222 may be formed over the CESL 221 and may fill gaps between the dummy gate structures 215A and 215C. In some embodiments, the dummy gate structures 215A and 215C are surrounded by the ILD layer 222. In addition, the CESL 221 may serve as an etch stop layer of the subsequent etching process configured to form source/drain contact holes (not shown).

In some embodiments, the CESL 221 may be a single layer or multiple layers. The CESL 221 may be made of silicon carbide (SiC), silicon nitride (SixNy), silicon carbonitride (SiCN), silicon oxycarbide (SiOC), silicon oxycarbon nitride (SiOCN), tetraethoxysilane (TEOS) or another applicable material. In some embodiments, the CESL 221 has a bi-layer structure which includes a TEOS layer formed on a SiC layer. A TEOS layer has better moisture prevention than a silicon carbide (SiC) layer. In addition, a SiC layer is used as a glue layer to improve adhesion between the underlying layer and the TEOS layer. In some embodiments, the CESL 221 is formed by performing a plasma enhanced chemical vapor deposition (CVD) process, a low pressure CVD process, an atomic layer deposition (ALD) process, or another applicable process.

After the CESL 221 is formed, a deposition process is performed to form the ILD layer 222 over the CESL 221. Afterwards, a planarization process is performed to level the top surfaces of CESL 221, the ILD layer 222, the gate spacers 218A and 218C, and the dummy gate structures 215A and 215C, as shown in FIG. 2K.

In some embodiments, the ILD layer 222 is made of silicon oxide. In some other embodiments, the ILD layer 222 is made of un-doped silicate glass (USG), fluorinated silicate glass (FSG), carbon-doped silicate glass, silicon nitride or silicon oxynitride.

In some embodiments, the ILD layer 222 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, bis-benzocyclobutenes (BCB), polytetratluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, ELK dielectric material is deposited by a plasma enhanced chemical vapor deposition (PECVD) process or by a spin coating process.

In some embodiments, the deposition process of the ILD layer 222 includes a plasma enhanced chemical vapor deposition (CVD) process, a low pressure CVD process, an atomic layer deposition (ALD) process, a spin-on coating process, or another applicable process. In some embodiments, the planarization process includes a chemical mechanical polishing (CMP) process, a grinding process, an etching process, another applicable process, or a combination thereof.

Figure 2L:
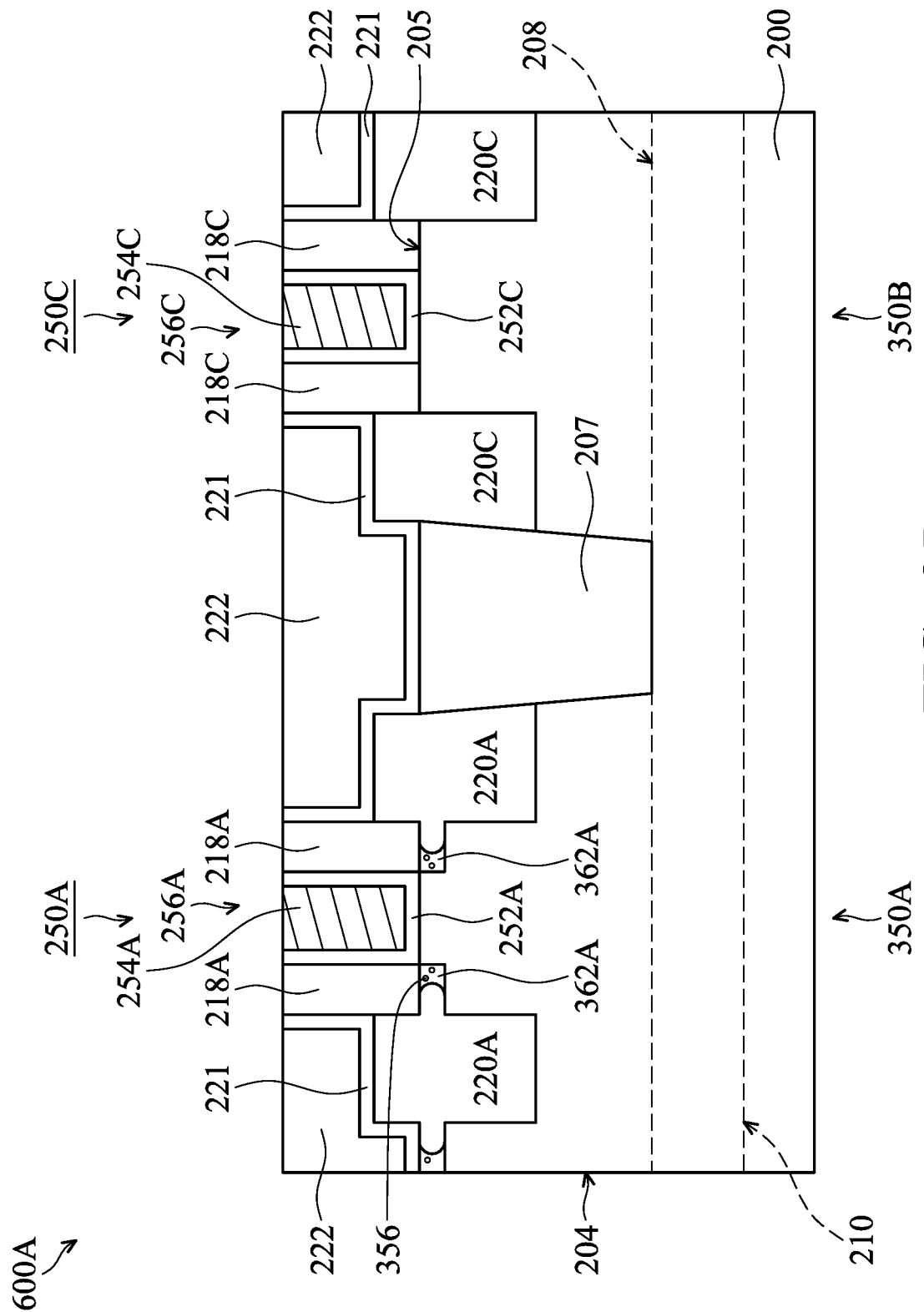

After the ILD layer 222 is formed, the dummy gate structures 215A and 215C are removed to form a trench 250A in the first region 350A and a trench 250C in the second region 350B, as shown in FIG. 2L in accordance with some embodiments. In addition, the trenches 250A and 250C are formed in the ILD layer 222. In some embodiments, a removal process is performed to remove the exposed hard mask layers 214A and 214C, and the underlying dummy gate structures 215A and 215C. As a result, trenches 250A and 250C are formed over the fin structure 204. In some embodiments, a trench 250A is formed between the source/drain features 220A and exposes a portion of the fin structure 204 that was previously covered by the dummy gate structure 215A. In addition, the trench 250C may be formed between the source/drain features 220C and exposes a portion of the fin structure 204 that was previously covered by the dummy gate structure 215C. In some embodiments, the removal process includes a wet etching process, a dry etching process, another applicable process, or a combination thereof.

After the trenches 250A and 250C are formed, metal gate structures 256A and 256C are respectively formed in the trenches 250A and 250C, as shown in FIG. 2L in accordance with some embodiments. The metal gate structures 256A and 256C are formed to replace the dummy gate structure 215A and 215C. In some embodiments, the metal gate structures 256A and 256C are formed over the fin structure 204. In addition, the metal gate structure 256A may be surrounded by the gate spacers 218A. The metal gate structure 256C may be surrounded by the gate spacers 218C.

In some embodiments, the metal gate structure 256A positioned in the first region 350A includes a gate dielectric layer 252A and a gate electrode layer 254A over the gate dielectric layer 252A. The gate dielectric layer 252A may conformally form over sidewalls and a bottom of each of the trench 250A. In addition, the gate electrode layer 254A may be formed over the gate dielectric layer 252A and filling the trench 250A. In some embodiments, the metal gate structure 256C positioned in the second region 350B includes a gate dielectric layer 252C and a gate electrode layer 254C over the gate dielectric layer 252C. The gate dielectric layer 252C may conformally form over sidewalls and a bottom of each of the trench 250C. In addition, the gate electrode layer 254C may be formed over the gate dielectric layer 252C and filling the trench 250C.

In some embodiments, the gate dielectric layers 252A and 252C include a single layer or multiple layers. In some embodiments, the gate dielectric layers 252A and 252C have a U-shape or a rectangular shape. In some embodiments, the gate dielectric layers 252A and 252C are formed of a high-k dielectric layer. The high-k dielectric layer may be made of hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gate dielectric layers 252A and 252C are made of a dielectric material with a dielectric constant in a range from about 12 to about 50.

In some embodiments, the gate dielectric layers 252A and 252C are formed by a deposition process, such as chemical vapor deposition (CVD), physical vapor deposition (PVD), atomic layer deposition (ALD), high density plasma CVD (HDPCVD metal organic CVD (MOCVD), or plasma enhanced CVD (PECVD), In some embodiments, a high-temperature annealing operation is performed to reduce or eliminate defects in the gate dielectric layers 252A and 252C.

In some other embodiments, before the gate dielectric layers 252A and 252C are is formed, an interfacial layer (not shown) is formed in the trenches 250A and 250C. The interfacial layer may be used to reduce stress between the gate dielectric layer s 252A and 252C and the fin structure 204. In some embodiments, the interfacial layer is made of silicon oxide. In some embodiments, the interfacial layer is formed by a deposition process, such as an ALD process, a thermal oxidation process, another applicable process, or a combination thereof.

In some embodiments, the gate electrode layers 254A and 254C are made of a conductive material, such as aluminum (Al), copper (Cu), tungsten (W), titanium (Ti), tantalum (Ta), or another applicable material. In some embodiments, the gate electrode layers 254A and 254C are formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

In some embodiments, a work function layer (not shown) may be formed between the gate dielectric layer 254A and the gate electrode layer 252A of the metal gate structure 256A and between the dielectric layer 254C and the gate electrode layer 252C of the metal gate structure 256C.

The work function layer (not shown) is made of metal material, and the metal material may include N-work-function or P-work-function metal. The Network-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal may include titanium nitride (TiN), tungsten nitride (WN), tantalum nitride (TaN), ruthenium (Ru) or a combination thereof.

Figure 2M:
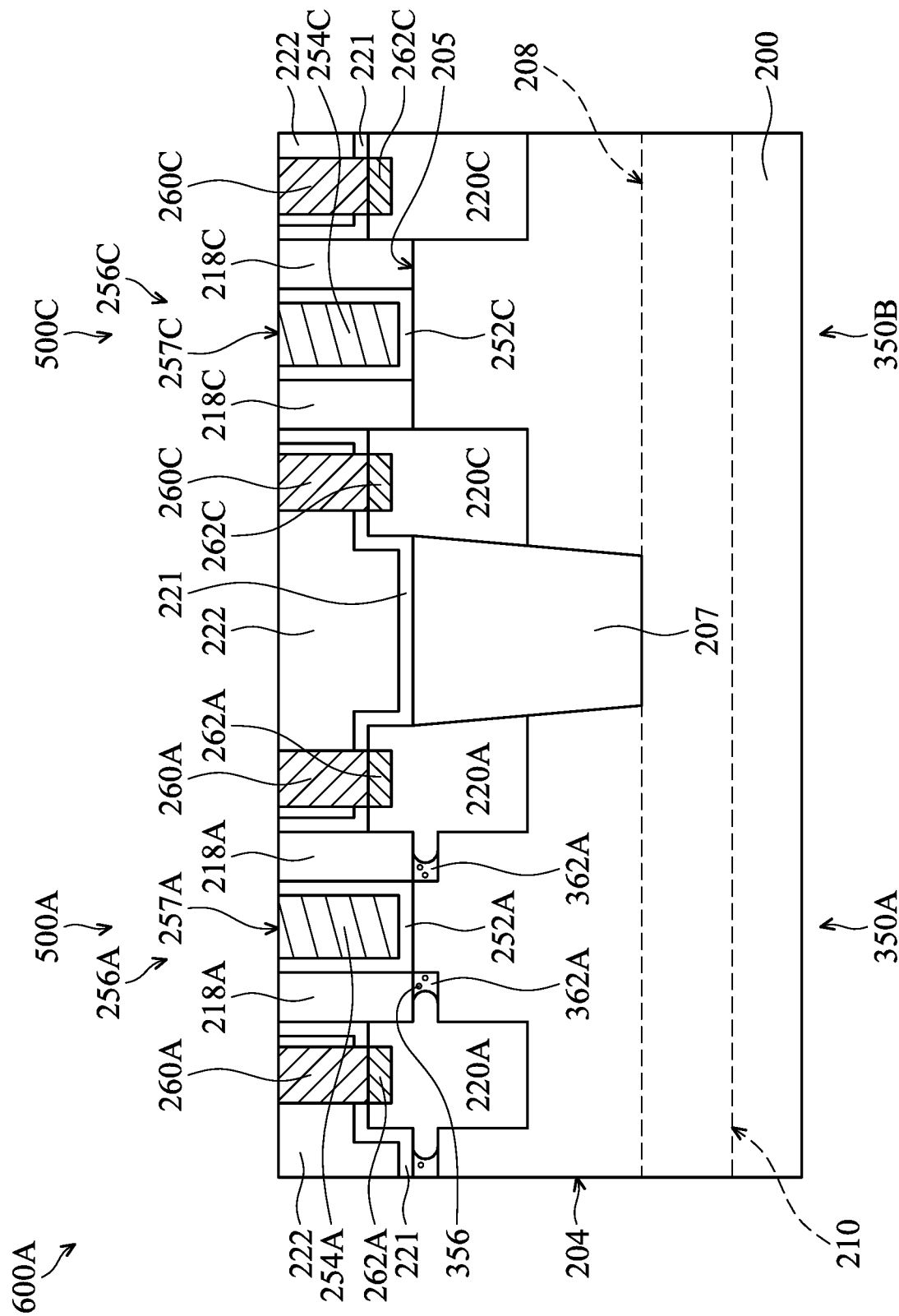

After the metal gate structures 256A and 256C are formed, source/drain silicide layers 262A and source/drain contact plugs 260A above the source/drain silicide layers 262A are formed over the source/drain features 220A in the first region 350A, as shown in FIG. 2M in accordance with some embodiments. In addition, the source/drain silicide layers 262C and source/drain contact plugs 260C above the source/drain silicide layers 262C are formed over the source/drain features 220C in the second region 350B.

In some embodiments, the formation of the source/drain silicide layers 262A and 262C and the source/drain contact plugs 260A and 260C includes performing a patterning process to remove portions of the first ELI) layer 252 and the CESL 221 to form contact openings (not shown) until the source/drain features 220A in the first region 350A and the source/drain features 220C in the second region 350B are exposed. Afterward, a silicidation process (not shown) is performed to form source/drain silicide layers 262A and 262C respectively in the contact openings and on the source/drain features 220A in the first region 350A and the source/drain features 220C in the second region 350B. Afterward, a filling process (not shown) is performed to form the source/drain contact plugs 260A and 260C filling the contact openings.

In some embodiments, the patterning process includes a photolithography process and a subsequent etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

In some embodiments, the silicidation process includes an etching-back process, a metal material deposition process and an annealing process performed in sequence. In some embodiments, the etching-back process of the silicidation process includes a dry etching process, a wet etching process, or another applicable process. In some embodiments, the deposition process of the silicidation process includes a physical vapor deposition (PVD) process, an atomic layer deposition (ALD) process, or another applicable process. In some embodiments, the annealing process of the silicidation process is performed at a temperature in a range from about 300° C. to about 800° C.

In some embodiments, the filling process includes a deposition process and a subsequent planarization process. In some embodiments, the deposition process of the filling process includes a physical vapor deposition (PVD) process, an atomic layer deposition (ALD) process, or another applicable process. In some embodiments, the deposition process includes a plating method. In some embodiments, the planarization process includes an etch-back process and/or a chemical mechanical polishing (CMP) process.

In some embodiments, the source/drain silicide layers 262A and 262C are formed of one or more of cobalt silicide (e.g., CoSi, $CoSi_2$, $Co_2Si$, $Co_2Si$, $Co_3Si$; collectively "Co silicide"), titanium silicide (e.g., $Ti_5Si_3$, TiSi, $TiSi_2$, $TiSi_3$, $Ti_6Si_4$; collectively "Ti silicide"), nickel silicide (e.g., $Ni_3Si$, $Ni_{31}Si_{12}$, $Ni_2Si$, $Ni_3Si_2$, NiSi, $NiSi_2$; collectively "Ni silicide"), copper silicide (e.g., $Cu_{17}Si_3$, $Cu_{56}Si_{11}$, $Cu_5Si$, $Cu_3Si_7$, $Cu_4Si$, $Cu_{19}Si_6$, $Cu_3Si,Cu_{87}Si_{13}$; collectively "Cu silicide"), tungsten silicide ($W_5Si_3$, $WSi_2$; collectively "W silicide"), and molybdenum silicide ($Mo_3Si$, $Mo_5Si_3$, $MoSi_2$; collectively "Mo silicide").

In some embodiments, the source/drain contact plugs 260A and 260C are made of a conductive material, such as copper (Cu), aluminum (Al), tungsten (W), titanium (Ti), titanium nitride (TiN), tantalum (Ta), tantalum nitride (TaN), or another applicable material.

After performing the aforementioned processes, a FinFET 500A is formed over the fin structure 204 in the first region 350A and a FinFET 500C is formed over the fin structure 204 in the second region 350B. Moreover, a semiconductor structure 600A including the FinFET 500A (e.g. the N-type FinFET) and the FinFET 500C (e.g. the P-type FinFET) is formed, as shown in FIG. 2M in accordance with some embodiments.

In some embodiments, the source/drain features 220A of the FinFET 500A of the semiconductor structure 600A include the upper portion 220A-1 formed laterally extending toward the channel region of the FinFET 500A in the first region 350A (e.g. the NMOS region). The source/drain features 220A may have closer proximity to the channel region of the FinFET 500A. In some other embodiments, the stages of a process for forming the source/drain features 220A is used to form the source/drain features of the P-type FinFET 500C of the semiconductor structure 600A.

FIGS. 3A-3J are cross-sectional views of various stages of a process for forming a semiconductor structure 600B after performing the stage of the process for forming a semiconductor structure 600B shown in FIGS. 1C and 2C. In addition, FIGS. 3A-3E illustrate various stages of a process for forming the source/drain features 220B of the FinFET 500B (e.g. the N-type FinFET) in the first region 350A (e.g. the NMOS region) of the semiconductor structure 600B. The materials, configurations, structures and/or processes of the semiconductor structure 600B may be similar to, or the same as, those of the semiconductor structure 600A, and the details thereof are not repeated herein.

Figure 3A:
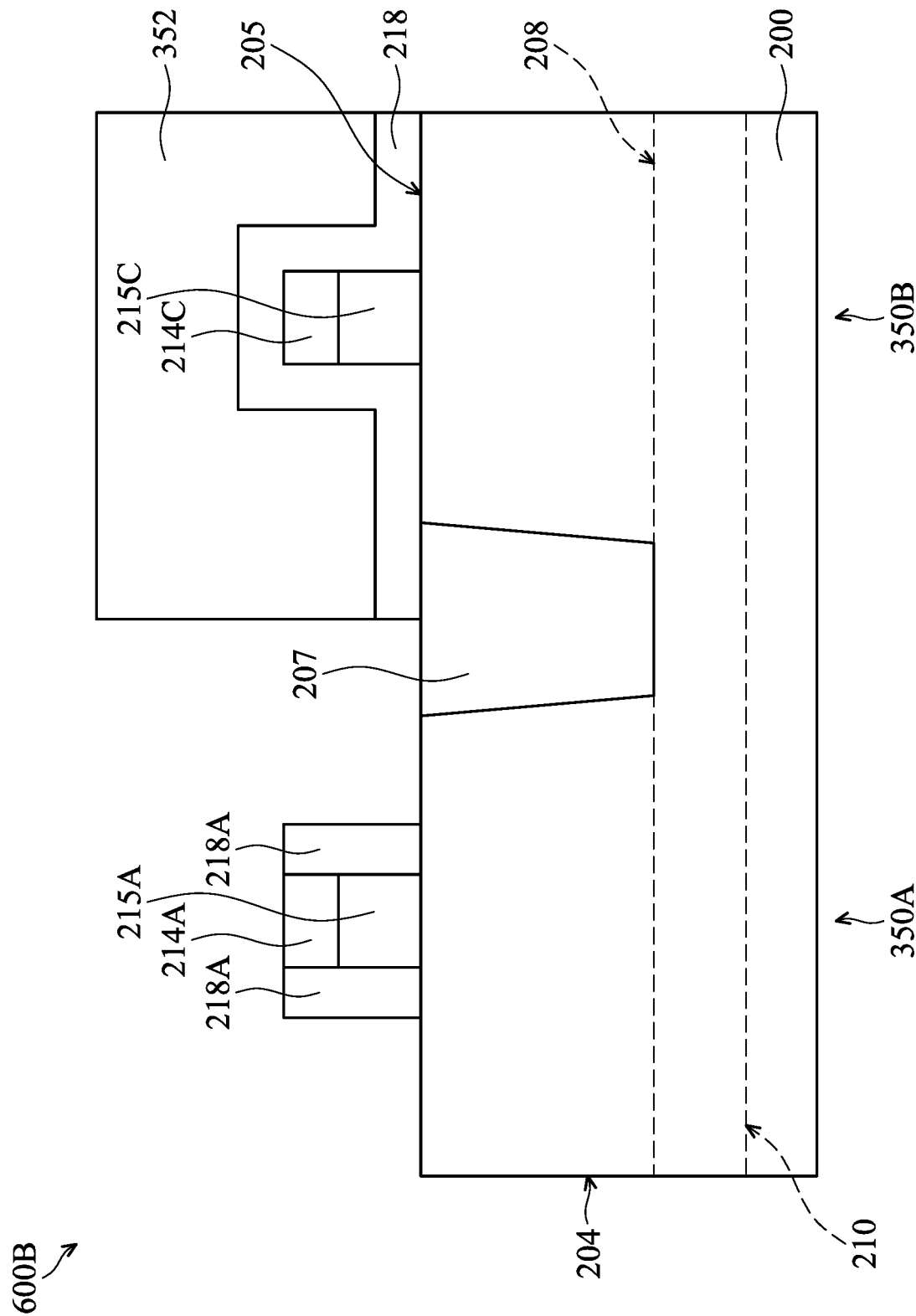
FIGS. 3A-3J are cross-sectional views of various stages of a process for forming a semiconductor structure, in accordance with some embodiments.

After the gate spacer layer 218 is formed shown in FIGS. 1C and 2C, a mask layer 352, such as a photoresist (PR), is formed to cover the fin structure 204 in the first region 350A, as shown in FIG. 3A in accordance with some embodiments. The materials, configurations, structures and/or processes of the mask layer 352 shown in FIG. 3A may be similar to, or the same as, those of the mask layer 352 shown in FIG. 3D, and the details thereof are not repeated herein.

Figure 3B:
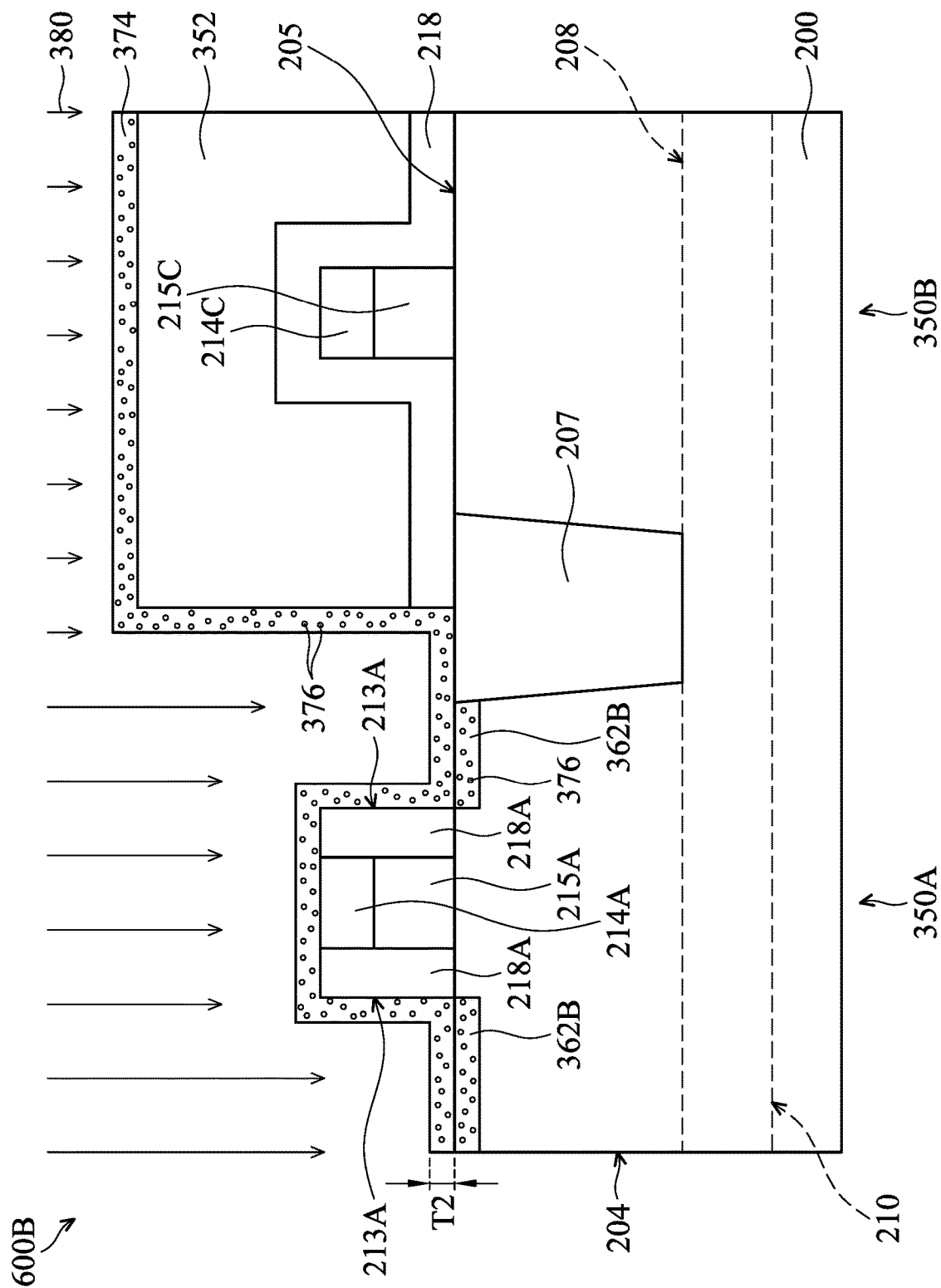

After the gate spacers 218A are formed, a plasma doping process 380 is performed for the first region 350A (e.g. the NMOS region), as shown in FIG. 3B in accordance with some embodiments. In some embodiments, the plasma doping process 380 includes a deposition process and a knock-on process. In addition, the deposition process and the knock-on process may be simultaneously performed in the same chamber of a semiconductor processing system. The deposition process of the plasma doping process 380 may be performed to form a dopant source layer 374 over the gate spacers 218A, the hard mask layer 214A and the dummy gate structure 215A in the first region 350A. In addition, the dopant source layer 374 is formed over the top surface 205 of the fin structure 204 that is not covered by the gate spacers 218A, the hard mask layer 214A and the dummy gate structure 215A.

In some embodiments, the dopant source layer 374 includes dopants 376. The dopants 376 may include boron (B) or indium (In). In some embodiments, the deposition process is performed by using a suitable dopant source gases (e.g. a P-type dopant source gases) for the s first region 350A (e.g. the NMOS region). For example, the dopant source gases may include the boron gas (e.g. $BH_3$ or $B_2H_6$). Furthermore, the deposition process may also include a dilution gas, such as argon (Ar), neon (Ne), helium (He), hydrogen (H), krypton (Kr), xenon (Xe), or a combination thereof. In some embodiments, a thickness T2 of the dopant source layer 374 is in a range from about 5 Å to 50 Å.

The knock-on process of the plasma doping process 380 is configured to drive the dopants 376 of the dopant source layer 374 into a portion of the fin structure 204 in the first region 350A (e.g. the NMOS region). The knock-on process may include injecting a knock-on gas in the first region 350A. The knock-on process may be used to uniformly push the dopants 376 of the dopant source layer 374 into the portion of the fin structure 204 from the top surface 205 of the fin structure 204. Therefore, the doped regions 362B including the dopants 376 are formed adjacent to the outer side ails 213A of the gate spacers 218A in the first region 350A. The knock-on process is performed by using an inert gas including xenon (Xe), helium (He), argon (Ar), neon (Ne), krypton (Kr), the like, or a combination thereof. In some embodiments, the plasma doping process 380 is performed using a gas source including the P-type dopant (e.g. B) and Xe, with an implantation energy in a range from about 0.1 KeV to about 10 KeV. A dosage of the dopants 376 (e.g. B) may be in a range from about 1E15 atoms/cm$^2$ to about 1E17 atoms/cm$^2$. The gas source (e.g. B and Xe) may be activated into plasma by any suitable method of generating the plasma, such as transformer coupled plasma generator, inductively coupled plasma systems, magnetically enhanced reactive ion etching, electron cyclotron resonance, a remote plasma generator, or the like.

After the plasma doping process 360 is performed, doped regions 362B are formed extending from the top surface 205 of the fin structure 204 into a portion of the fin structure 204. In addition, the doped regions 362B are formed outside the outer sidewalls 213A of the gate spacers 218A in the first region 350A. The concentration of the dopants 376 in the doped regions 362B may be in a range from about 1E19 atoms/cm$^3$ to about 1E21 atoms/cm$^3$.

After the doped regions 362B are formed, the dopant source layer 374 is removed from the first region 350A using a wet etching process or other suitable method. In some embodiments, a wet etching process is performed using sulfuric peroxide mixture (SPM), which is an acid including $H_2SO_4$ and $H_2O_2$. The SPM has an etch selectivity between the dopant source layer 374 and the gate spacers 218A and between the dopant source layer 374 and the hard mask layer 214A. Therefore, the SPM may remove dopant source layer 374 without substantially attacking the gate spacers 218A and the hard mask layer 214A. In some embodiments, the wet etching process conditions (e.g. time, temperature) are controlled such that the wet etching process removes the dopant source layer 374 without substantially removing the dopants 376 in the doped regions 362B (and embedded in the gate spacers 218A) in the first region 350A. In some embodiments, the wet etching process is performed for a time interval in a range from about 15 seconds to about 180 seconds, such as 45 seconds, using a high temperature SPM solution at a temperature in a range from about 80° C. to about 200° C.

Figure 3C:
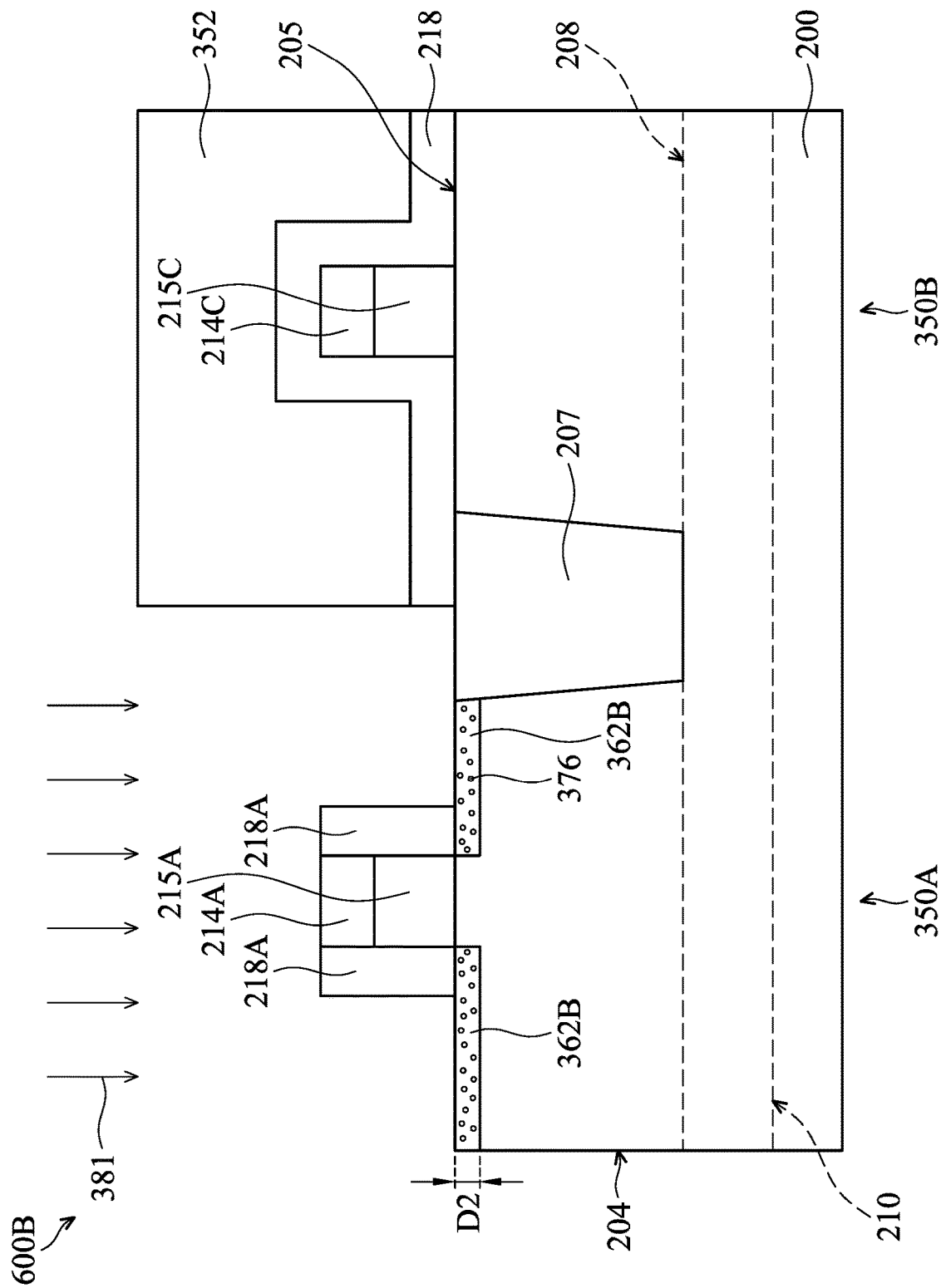

After the dopant source layer 374 is removed, an annealing process 381 is performed to diffuse the dopants 376, so that the diffused doped region 362B is formed in a portion of the fin structure 204, as shown in FIG. 3C in accordance with some embodiments. In some embodiments, the diffused doped region 362B is laterally (along the direction 300) diffused under the gate spacers 218A. In other words, the diffused doped region 362B overlaps the gate spacers 218A. The diffused doped region 362B may have a depth D2 in a range from about 0.1 nm to 10 nm. The depth D2 is along a direction perpendicular to the top surface 205 of the fin structure 204. In some embodiments, the annealing process 381 may be performed in the same chamber as the plasma doping process 380. In some embodiments, the annealing process 381 may be performed in a chamber different from the chamber used in the plasma doping process 360. The annealing process 381 may activate the dopants 376 (e.g. the P-type dopants) in the doped regions 362B. In addition, the annealing process 381 may drive the dopant 376 (e.g. the P-type dopant) embedded in the gate spacers 218B into the fin structure 204 in the second region 350B. In some embodiments, the annealing process 381 is a spike annealing process performed at a temperature in a range from about 1000° C. and about 1050° C., such as 1045° C., for a time interval in a range from about 1 second to about 2 seconds, and in a ambient including $O_2$.

Figure 3D:
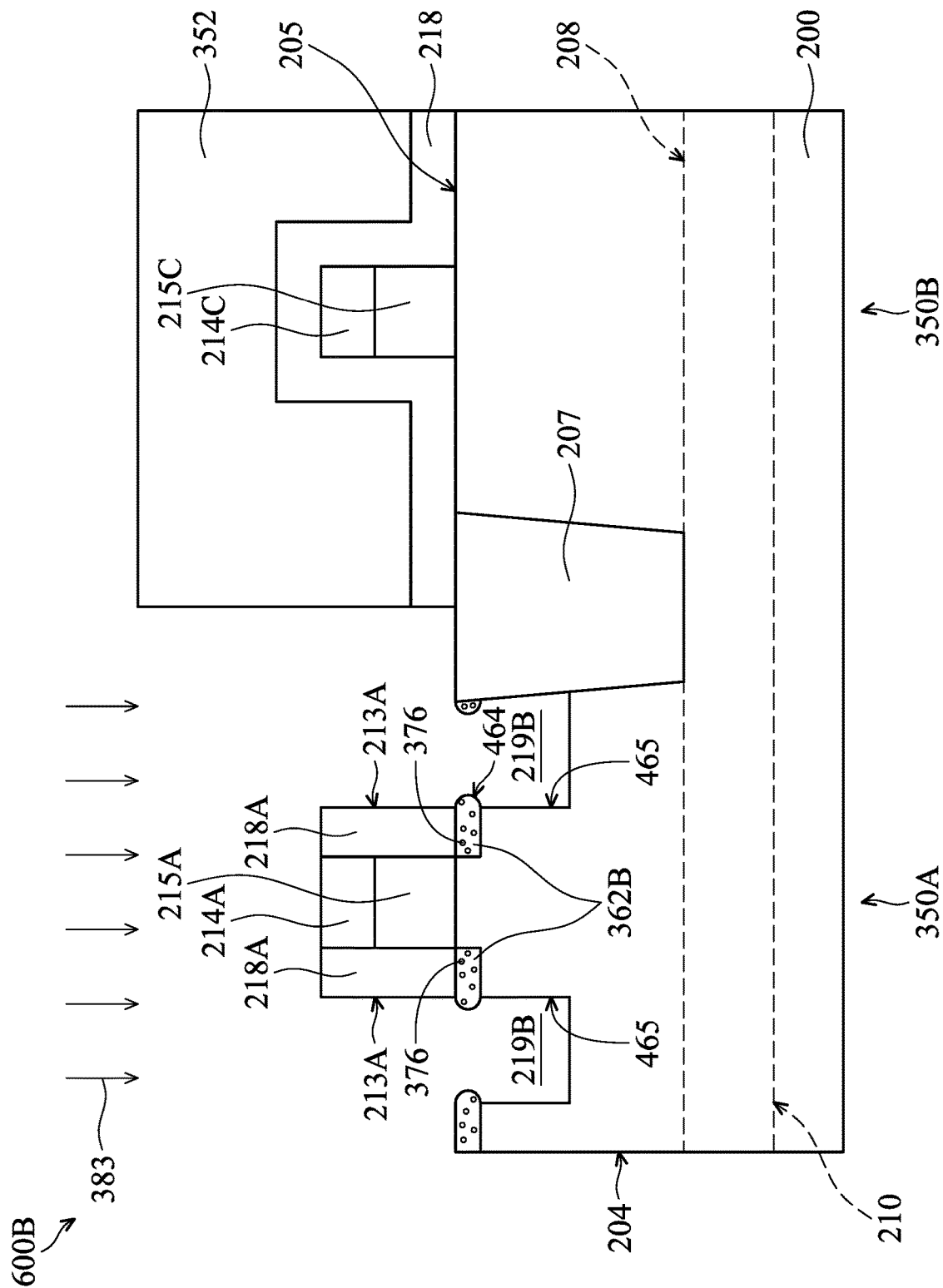

After the diffused doped region 362B is formed, an etching process 383 is performed to remove the doped region 362B and the underlying fin structure 204 in the second region 350B and not covered by the dummy gate structure 215A and the gate spacers 218A, as shown in FIG. 3D in accordance with some embodiments. The etching process 383 is performed to form recesses 219B adjacent the gate spacers 218A and in the fin structure 204 in the first region 350A. The recesses 219B are configured to provide positions of a source/drain features formed in the subsequent processes.

In some embodiments, the etching process 383 has a first etching rate during the removal of the doped region 362B including the dopants 376 in the first region 350A of the fin structure 204 and has a second etching rate during the removal of the fin structure 204 underlying the doped region 362B. The dopants 376 (e.g. the P-type dopants) in the doped region 362B may decrease the etching rate due to the lower electron density caused by coulomb repulsion. Therefore, the first etching rate may be different from the second etching rate. For example, the first etching rate of the etching process 383 is slower than the second etching rate of the etching process 383. In some embodiments, the etching process 383 is a dry etching process. In some embodiments, etching gases used in the etching process 383 include HBr, $NF_3$, $O_2$ and other suitable etching gases.

In some embodiments, each of the recesses 219B has an upper sidewall portion 464 adjacent to the top surface 205 of the fin structure 204 and a lower sidewall portion 465 below the upper portion 464. The upper sidewall portion 464 and the lower sidewall portion 465 of each of the recesses 219B may be close to the channel region of the semiconductor structure 600B. The upper sidewall portion 464 is adjacent to and is surrounded by the doped region 362B. In addition, the lower sidewall portion 465 is adjacent to the upper portion 464. Moreover, the lower sidewall portion 465 is positioned outside and below the doped region 362B. In some embodiments, the upper portion 464 of each of the recesses 219B is positioned directly below the corresponding gate spacer 218A, and the lower sidewall portion 465 is aligned the outer sidewall 213. A of the corresponding gate spacer 218A.

In some embodiments, the upper sidewall portion 464 and the lower sidewall portion 465 of each of the recesses 219B have different profiles in the cross-sectional view (FIG. 3D) along the longitudinal direction of the fin structure 204 (e.g. the direction 300). For example, the upper sidewall portion 464 may be a rounded (curved) and convex sidewall portion, and the lower sidewall portion 465 may be a substantially straight sidewall portion. Therefore, the upper sidewall portion 464 and the lower sidewall portion 465 may collectively form a bent sidewall of each of the recesses 219B. The bent sidewall of each of the recesses 219B is positioned adjacent to the channel region and the corresponding gate spacer 218A of the semiconductor structure 600B.

Figure 3E:
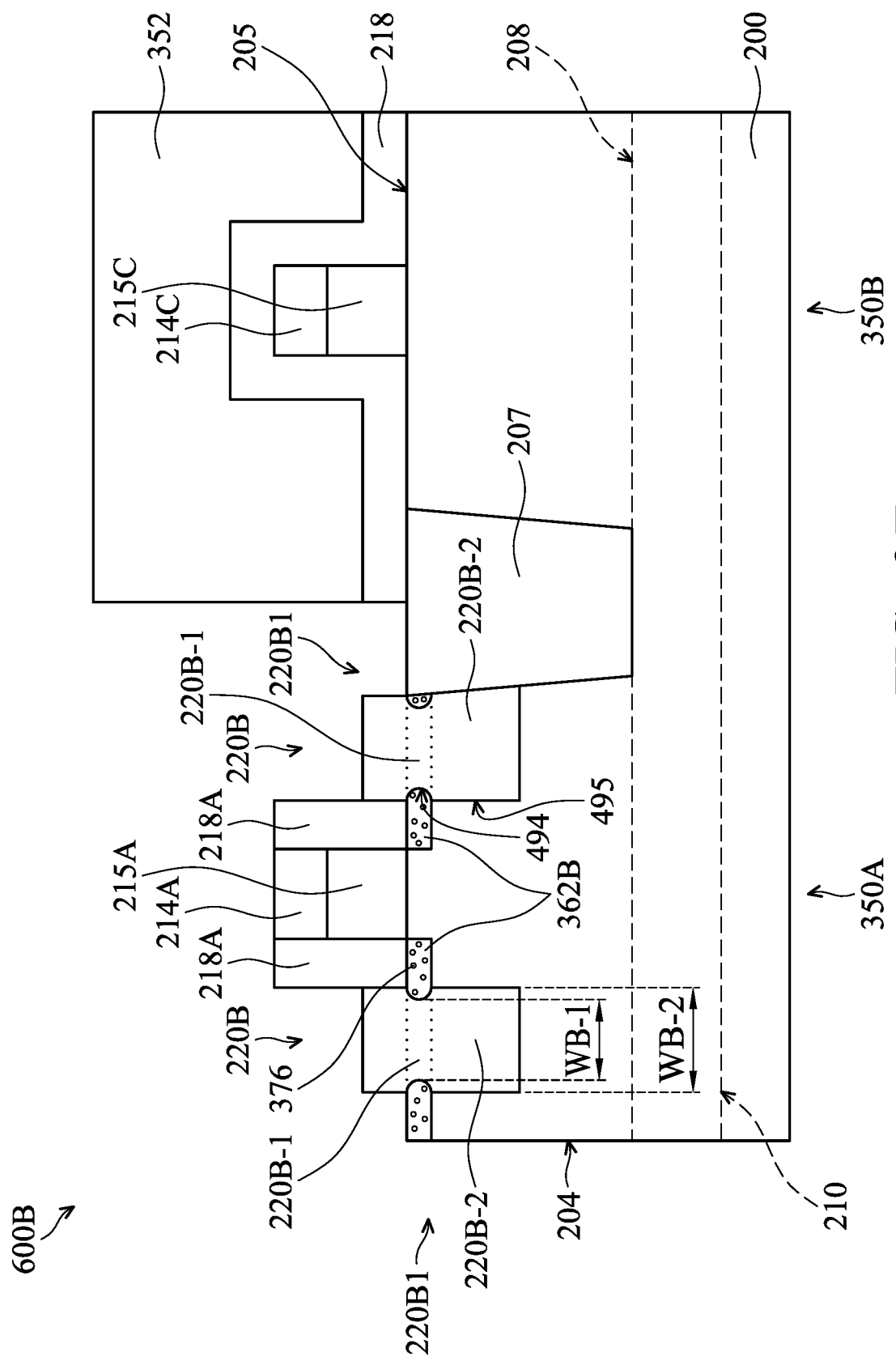

After the recesses 219B is formed in the fin structure 204 in the first region 350A, source/drain features 220B are formed in the recesses 219B in the second region 350B of the fin structure 204, as shown in FIG. 3E in accordance with some embodiments. In some embodiments, the filling process (not shown) is performed by filling the recesses 219B with one or more strained semiconductor materials to form the source/drain features 220B.

In some embodiments, the source/drain features 220B are formed adjacent to or next to the lightly doped regions (not shown) close to the dummy gate structure 215A. The source/drain features 220B are respectively formed on the opposites of the dummy gate structure 215A. In some embodiments, each of the source/drain features 220B has a portion 220B1 embedded in the fin structure 204 (and below the top surface 205 of the fin structure 204. The portion 220B1 may have an upper sidewall portion 494 and a lower sidewall portion 495. The upper sidewall portion 494 of the portion 220B1 may be adjacent to the top surface 205 of the fin structure 204 and close to the channel region of the semiconductor structure 600B. In addition, the upper sidewall portion 494 of the portion 220B1 may be surrounded by the doped region 362B. The lower sidewall portion 495 of the portion 220B1 may be positioned below the upper sidewall portion 494.

In some embodiments, the upper sidewall portion 494 of the portion 220B1 has a rounded (curved) and concave profile, and the lower sidewall portion 495 of the portion 220A1 has a straight profile shown in FIG. 3E. Therefore, a first curve radius of the upper sidewall portion 494 of the portion 220B1 may be different from a second curve radius of the lower sidewall portion 495 of the portion 220B1 in the cross-sectional view (FIG. 2l1) along the longitudinal direction of the fin structure 204 (e.g. the direction 300). In addition, the absolute value of the first curve radius of the upper sidewall portion 494 is less than the absolute value of the second curve radius of the lower sidewall portion 495 of the portion 220B1 of the source/drain feature 220B in the first region 350A. For example, the first curve radius of the upper sidewall portion 494 has a negative value, and the second curve radius of the lower sidewall portion 495 has an infinite value.

In some embodiments, the portion 220B1 of each of the source/drain features 220B in the first region 350A includes an upper portion 220B-1 and a lower portion 220B-2. The upper portion 220BA-1 is positioned close to the top surface 205 of the fin structure 204 and overlapping the corresponding gate spacer 218A. In addition, the lower portion 220B-2 is positioned below the upper portion 220B-1. The upper portion 220B-1 of the portion 220B1 of each of the source/drain features 220B in the second region 350B has a concave edge (i.e. the upper sidewall portion 494). The lower portion 220B-2 of the portion 220B1 of each of the source/drain features 220B in the first region 350A has a straight edge (i.e. the lower sidewall portion 495). Furthermore, the width WB-1 of the first upper portion 220B-1 is less than the width WB-2 of the first lower portion 220B-2.

In some embodiments, the plasma doping process 380 is performed to form the doped region 362B having a shallow depth (e.g. the depth D1 in a range from about 0.1 nm to 10 nm) and a heavy concentration of P-type dopants (e.g. in a range from about 1E19 atoms/cm$^3$ to about 1E21 atoms/cm$^3$), the upper portion 220B-1 of the portion 220B1 of each of the source/drain features 220B is formed laterally extending away from the channel region of the semiconductor structure 600B in the first region 350A (e.g. the NMOS region), the carrier mobility and the device performance of the semiconductor structure 600B can be improved by adjusting the proximity of the embedded portion (the upper portion 220B-1 of the portion 220B1) of the source/drain features 220B (i.e. the distance between the upper portion 220B-1 of the portion 220B1 and the channel region of the resulting finFET 500B of the semiconductor structure 600B).

In some embodiments, the source/drain features 220B may include a strain material to apply stress to the channel region 315. For example, the source/drain features 220A are formed of Ge, SiGe, InAs, InGaAs, InSb, GaAs, GaSb, InAlP, InP, or the like. In some embodiments, the lattice constant of the source/drain features 220B are different from the lattice constant of the fin structure 204. In some embodiments, the source/drain features 220B have a diamond shape. In some embodiments, a top of each of the source/drain features 220B is higher than the top surface 205 of the fin structure 204.

In some embodiments, the filling process includes an epitaxial process, such as a selective epitaxial growth (SEG) process, CVD deposition techniques (e.g. vapor-phase epitaxy (VPE) and/or ultra-high vacuum CVD (UHV-CVD)), molecular beam epitaxy, or another suitable epitaxial process. After the source/drain features 220B are formed in the fin structure 204 in the first region 350A, the mask layer 352 is removed.

Figure 3F:
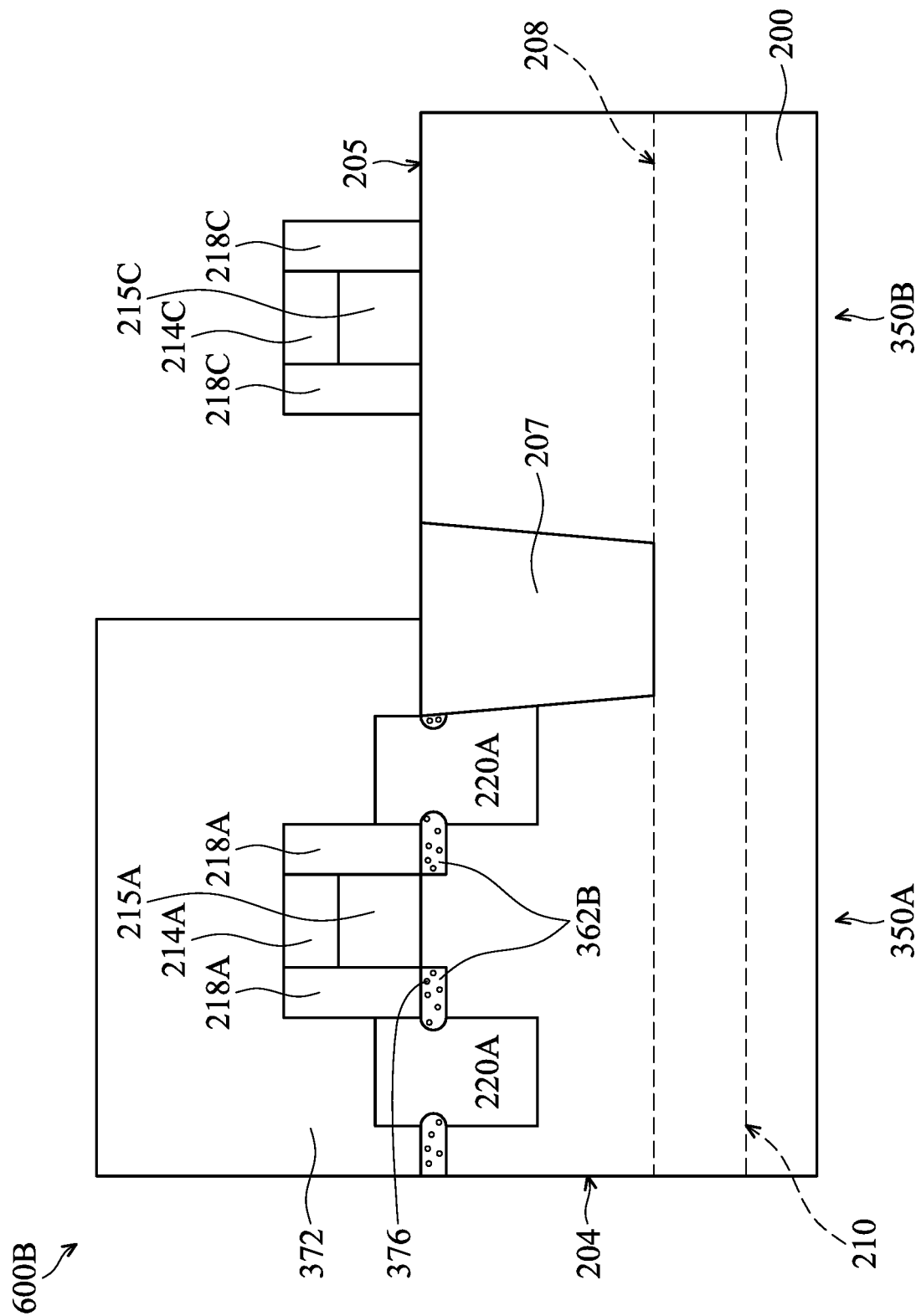

After the source/drain features 220B are formed, a mask layer 372, such as a photoresist (PR), is formed to cover the fin structure 204 in the first region 350A, as shown in FIG. 3F in accordance with some embodiments. The materials, configurations, structures and/or processes of the mask layer 372 shown in FIG. 3F may be similar to, or the same as, those of the mask layer 372 shown in FIG. 2I, and the details thereof are not repeated herein.

Figure 3G:
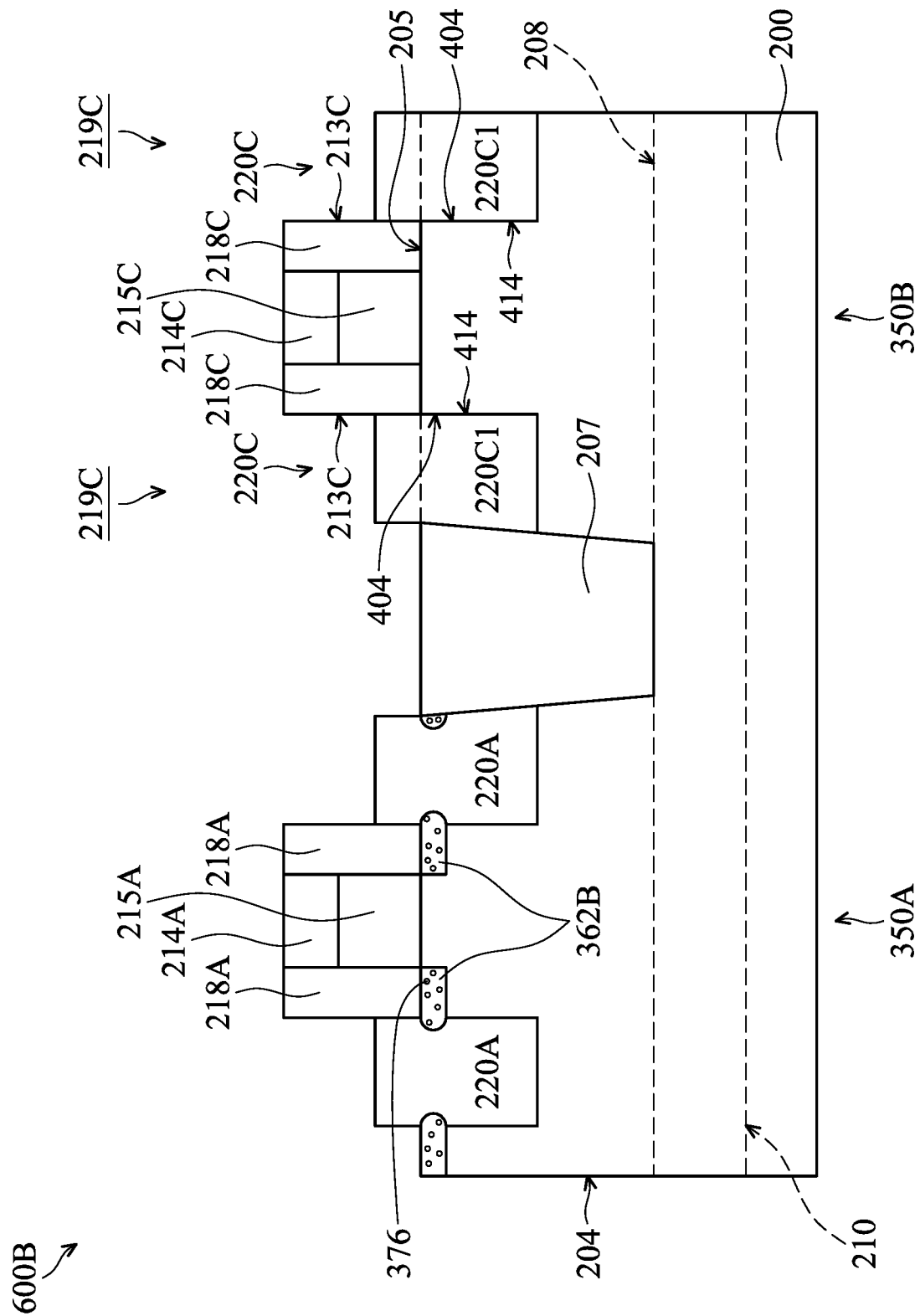

After the gate spacers 218C are formed, recesses 219C are formed adjacent the gate spacers 218C and in the fin structure 204 in the second region 350B. In addition, source/drain features 220C are formed in the recesses 219C in the second region 350B of the fin structure 204, as shown in FIG. 3G in accordance with some embodiments. The position, profile and/or processes of the recesses 219C shown in FIG. 3G may be similar to, or the same as, those of the recesses 219C shown in FIG. 2J, and the details thereof are not repeated herein. The materials, configurations, structures and/or processes of the source/drain features 220C shown in FIG. 3G may be similar to, or the same as, those of the source/drain features 220C shown in FIG. 2J, and the details thereof are not repeated herein.

Figure 3H:
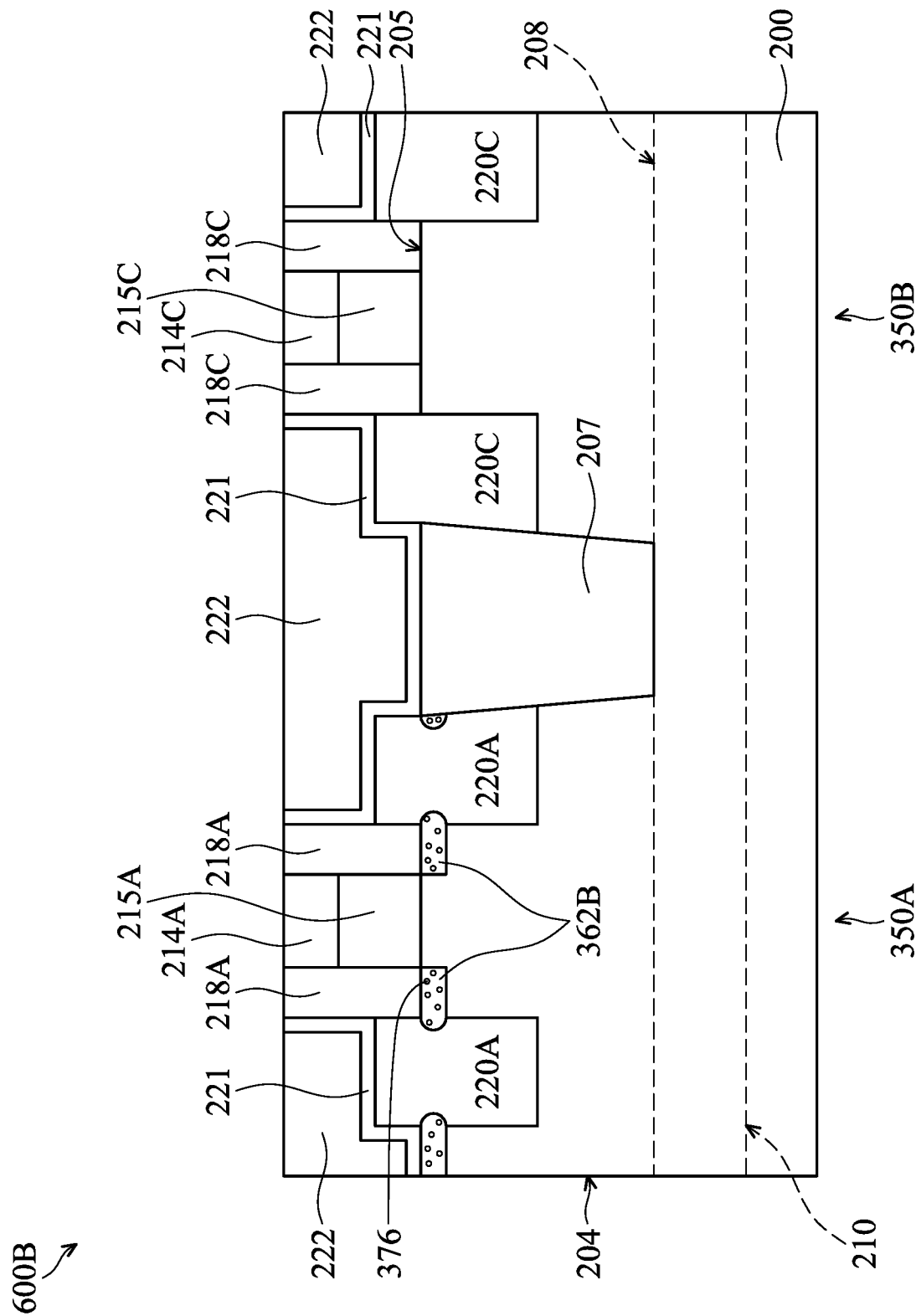
Figure 3:
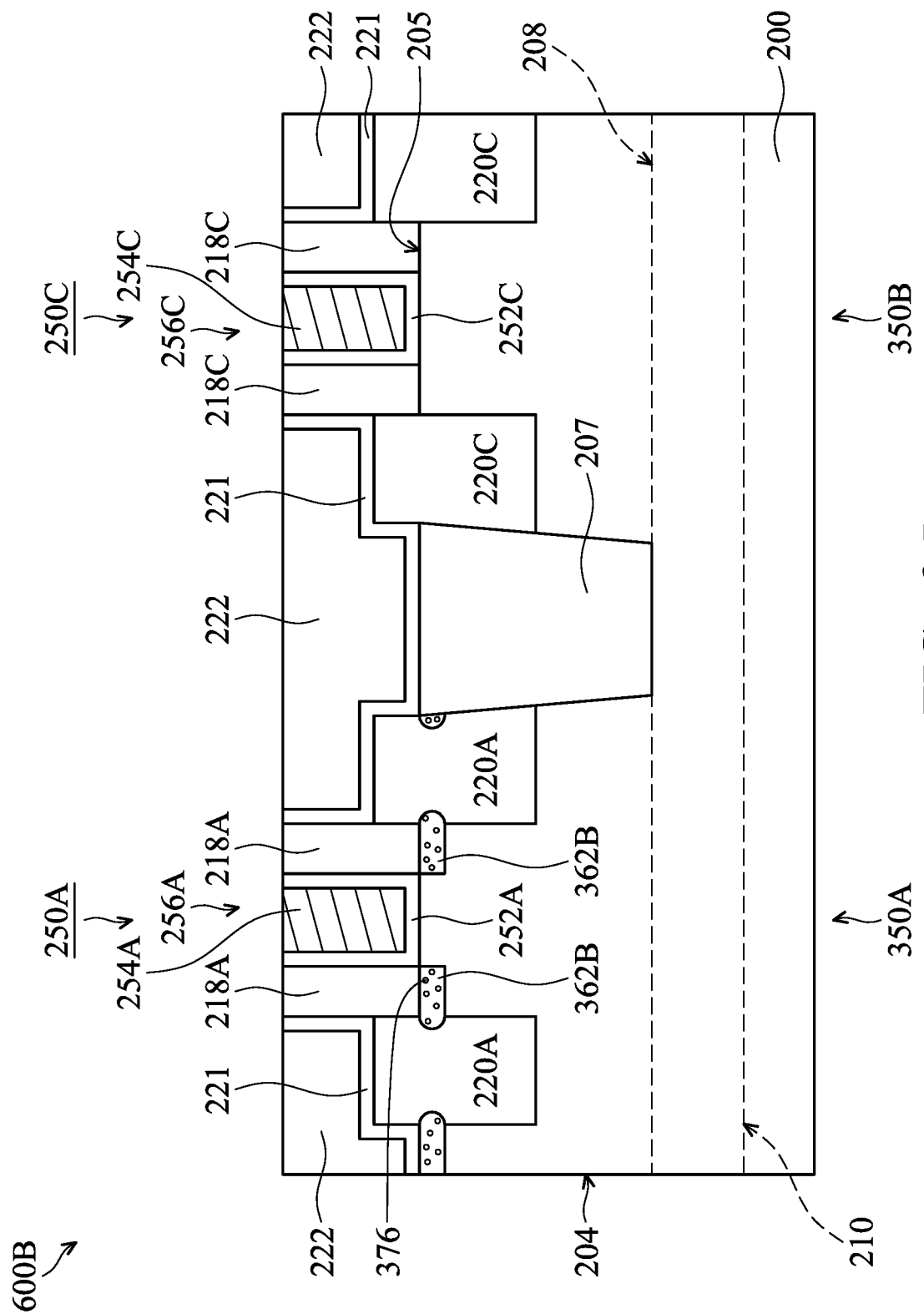

After the source/drain features 220C are formed, a contact etch stop layer (CESL) 221 and an inter-layer dielectric (ILD) layer 222 are formed over the fin structure 204, the source/drain features 220B and 220C, and the dummy gate structures 215A and 215C, as shown in FIG. 3H in accordance with some embodiments. The materials, configurations, structures and/or processes of the CESL 221 and the ILD layer 222 shown in FIG. 3G may be similar to, or the same as, those of the CESL 221 and the ILD layer 222 shown in FIG. 2J, and the details thereof are not repeated herein.

After the ILD layer 222 is formed, the dummy gate structures 215A and 215C are removed to form a trench 250A in the first region 350A and a trench 250C in the second region 350B. Afterwards, metal gate structures 256A and 256C are respectively formed in the trenches 250A and 250C, as shown in FIG. 3I in accordance with some embodiments. The position, profile and/or processes of the trenches 250A and 250C shown in FIG. 3I may be similar to, or the same as, those of the trenches 250A and 250C shown in FIG. 2L, and the details thereof are not repeated herein. The materials, configurations, structures and/or processes of the metal gate structures 256A and 256C shown in FIG. 3I may be similar to, or the same as, those of the metal gate structures 256A and 256C shown in FIG. 2L, and the details thereof are not repeated herein.

Figure 3J:
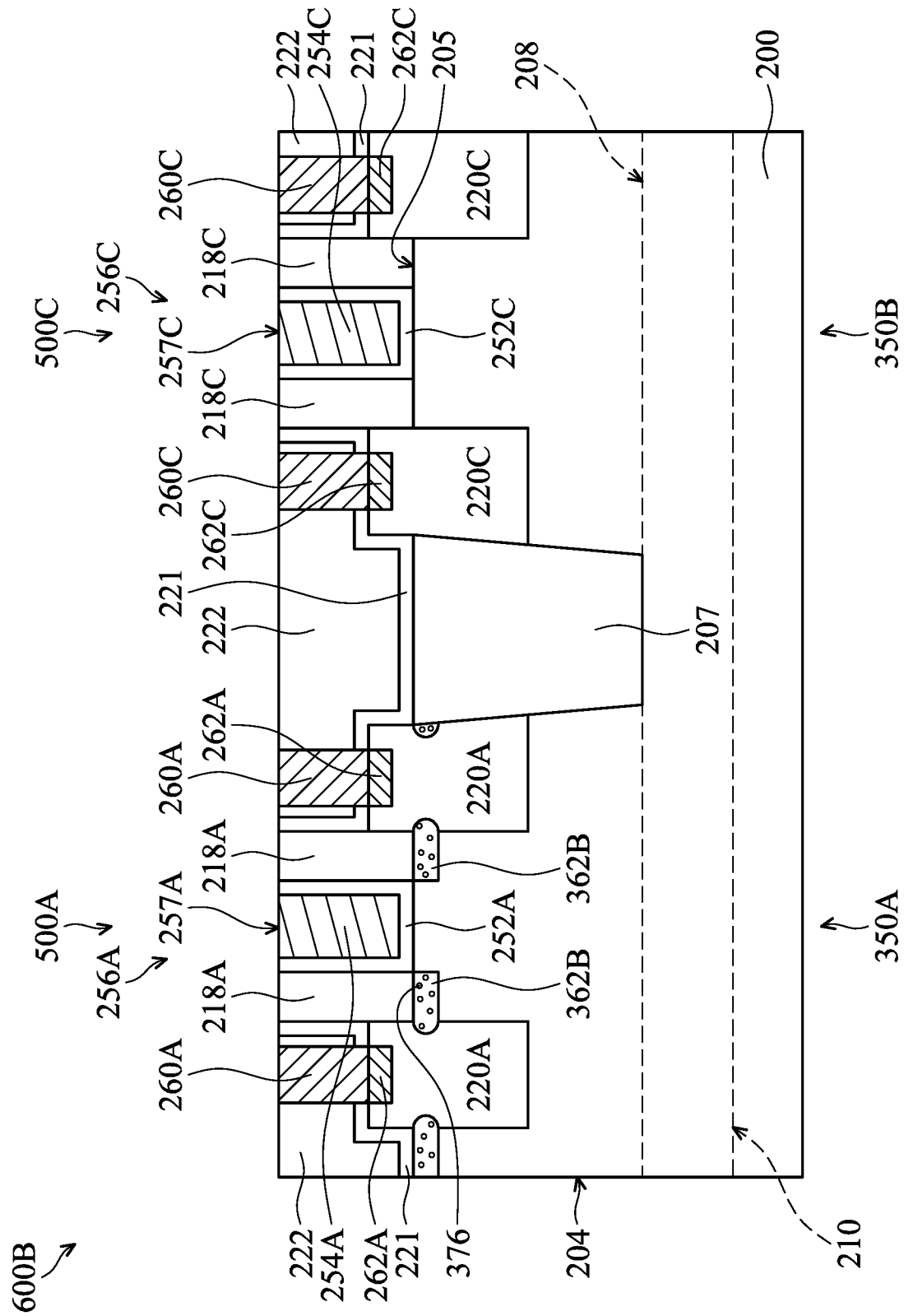

After the metal gate structures 256A and 256C are formed, source/drain silicide layers 262A and source/drain contact plugs 260A above the source/drain suicide layers 262A are formed over the source/drain features 220B in the first region 350A. In addition, the source/drain silicide layers 262C and source/drain contact plugs 260C above the source/drain silicide layers 262C are formed over the source/drain features 220C in the second region 350B, as shown in FIG. 3J in accordance with some embodiments. The materials, configurations, structures and/or processes of the source/drain silicide layers 262A, 262B and the source/drain contact plugs 260A, 260C shown in FIG. 3J may be similar to, or the same as, those of source/drain silicide layers 262A and source/drain contact plugs 260A shown in FIG. 2M, and the details thereof are not repeated herein.

After performing the aforementioned processes, a FinFET 500B is formed over the fin structure 204 in the first region 350A and a FinFET 500C is formed over the fin structure 204 in the second region 350B. Moreover, a semiconductor structure 600B including the FinFET 500B (e.g. the N-type FinFET) and the FinFET 500C (e.g. the P-type FinFET) is formed, as shown in FIG. 3J in accordance with some embodiments.

In some embodiments, the source/drain features 220B of the FinFET 500B include the upper portion 220B-1 formed laterally extending away from the channel region of the FinFET 500B in the first region 350A (e.g. the NMOS region). The source/drain features 220B may have a farer proximity to the channel region of the FinFET 500B. In some other embodiments, the stages of a process for forming the source/drain features 220B is used to form the source/drain features of the P-type FinFET 500C of the semiconductor structure 600B.

Embodiments of a semiconductor structure (e.g. the semiconductor structure 600A and the semiconductor structure 600B) and a method for forming the same are provided. The semiconductor structure includes a gate structure (e.g. the dummy gate structure 215A and the metal gate structure 256A) and a source/drain feature (e.g. the source/drain features 220A and 220B). The gate structure is positioned over a fin structure (e.g. the fin structure 204). The source/drain feature is positioned adjacent to the gate structure. A portion (e.g. the portions 220A1 and 220B1) of the source/drain feature embedded in the fin structure has an upper sidewall portion (e.g. the upper sidewall portions 394 and 494) adjacent to a top surface (e.g. the top surface 205) of the fin structure and a lower sidewall portion (e.g. the lower sidewall portions 395 and 495) below the upper sidewall portion. A first curve radius of the upper sidewall portion is different from a second curve radius of the lower sidewall portion in a cross-sectional view substantially along the longitudinal direction of the fin structure. The semiconductor structure further includes a doped region (e.g. the doped region 362A and 362B) formed in an upper portion of the fin structure and adjacent to the gate structure by a plasma doping process. In some embodiments, the doped region has a shallow depth (e.g. the depth D1 in a range from about 0.1 nm to 10 nm) and a heavy concentration of N-type (or P-type) dopants (e.g. in a range from about 1E19 atoms/cm$^3$ to about 1E21 atoms/cm$^3$). During the etching process of the source/drain features, the etching process have different etching rates in the doped region and the underlying portion of the fin structure. Therefore, the distance between the gate structure and the upper portion of the source/drain feature embedded in the fin structure (i.e. the proximity of the source/drain feature) can be precisely controlled. The carrier mobility and the device performance of the semiconductor structure can be improved.

Embodiments of a semiconductor structure and a method for forming the same are provided. The semiconductor structure includes a gate structure and a source/drain feature. The gate structure is positioned over a fin structure. The source/drain feature is positioned adjacent to the gate structure. A portion of the source/drain feature embedded in the fin structure has an upper sidewall portion adjacent to a top surface of the fin structure and a lower sidewall portion below the upper sidewall portion. A first curve radius of the upper sidewall portion is different from a second curve radius of the lower sidewall portion in a cross-sectional view substantially along the longitudinal direction of the fin structure. In some embodiments, the semiconductor structure uses a shallow and heavily doped region to change the profile of the upper sidewall portion of source/drain feature. Therefore, the distance between the gate structure and the upper portion of the source/drain feature embedded in the fin structure can be precisely controlled. The carrier mobility and the device performance of the semiconductor structure can be improved.

In some embodiments, a semiconductor structure is provided. The semiconductor structure includes a gate structure and a source/drain feature. The gate structure is positioned over a top surface and extending over sidewalls of a fin structure. The source/drain feature is positioned adjacent to the gate structure. A portion of the source/drain feature embedded in the fin structure has an upper sidewall portion adjacent to a top surface of the fin structure and a lower sidewall portion below the upper portion. A first curve radius of the upper sidewall portion is different from a second curve radius of the lower sidewall portion in a cross-sectional view substantial along the longitudinal direction of the fin structure.

In some embodiments, a semiconductor structure is provided. The semiconductor structure includes a fin structure, a first gate structure, first gate spacers, a second gate structure, first source/drain features second and source/drain features. The fin structure protrudes from a substrate and extending along a first direction. The fin structure has a first region and a second region arranged along a first direction. The first gate structure is positioned over the fin structure in the first region. The first gate spacers are positioned on opposite sidewalls of the first gate structure. The second gate structure is positioned over the fin structure in the second region. The second gate spacers are positioned on opposite sidewalls of the second gate structure. The first source/drain features are positioned in the fin structure in the first region and adjacent to the outer sidewalls of the first gate spacers. A portion of each of the first source/drain features embedded in the fin structure includes a first upper sidewall portion adjacent to a top surface of the fin structure. The second source/drain features are positioned in the fin structure in the second region and adjacent to the outer sidewalls of the second gate spacers. A portion of each of the second source/drain features embedded in the fin structure includes a second sidewall portion. A first curvature of the first upper sidewall portion is different from a second curvature of the second upper sidewall portion.

In some embodiments, a method for forming a semiconductor structure is provided. The method includes forming a first gate structure over a fin structure and in a first region of the fin structure. The method also includes forming first gate spacers over the fin structure and on the opposite sidewalls of the first gate structure. The method further includes performing a deposition process to form a dopant source layer over the first gate structure, the first gate spacers and the fin structure. The method further includes performing a knock-on process to drive dopants of the dopant source layer into the first region of the fin structure. The method further includes removing the dopant source layer. The method further includes performing an annealing process to diffuse the dopant, so that a doped region is formed in a portion of the fin structure.

In some embodiments, a method for forming a semiconductor structure includes forming a fin structure over a substrate. The method also includes forming a gate structure across the fin structure. The method also includes depositing a dopant source layer over the gate structure. The method also includes driving dopants of the dopant source layer into the fin structure. The method also includes removing the dopant source layer. The method also includes annealing the dopants in the fin structure to form a doped region. The method also includes etching the doped region and the fin structure below the doped region to form a recess. The method also includes growing a source/drain feature in the recess.

In some embodiments, a method for forming a semiconductor structure includes forming a first gate structure over a fin structure in a first region of a substrate. The method also includes forming a second gate structure over the fin structure in a second region of the substrate. The method also includes covering the second gate structure with a first mask layer. The method also includes forming a dopant source layer over the first gate structure and the first mask layer. The method also includes driving dopants of the dopant source layer into the fin structure in the first region. The method also includes removing the dopant source layer. The method also includes laterally diffusing the dopants to form a doped region in the fin structure. The method also includes etching the doped region and the fin structure in the first region and forming a first recess besides the first gate structure in a first region. The method also includes growing a first source/drain feature in the first recess. The method also includes removing the first mask layer. The method also includes forming a second source/drain feature besides the second gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a fin structure over a substrate;
    forming a gate structure across the fin structure;
    forming spacers over opposite sides of the gate structure;
    depositing a dopant source layer over the gate structure and the spacers;
    driving dopants of the dopant source layer into the fin structure;
    removing the dopant source layer;
    annealing the dopants in the fin structure to form a doped region;
    etching the doped region and the fin structure below the doped region to form a recess; and
    growing a source/drain feature in the recess.

2. The method for forming a semiconductor structure as claimed in claim 1, wherein the doped region is laterally etched above the fin structure.

3. The method for forming a semiconductor structure as claimed in claim 1, wherein the dopants of the dopant source layer are driven into a portion of the fin structure from a top surface of the fin structure which is in contact with the dopant source layer.

4. The method for forming a semiconductor structure as claimed in claim 1, wherein the doped region is laterally diffused under the spacers after annealing the dopants.

5. The method for forming a semiconductor structure as claimed in claim 1, wherein the depositing a dopant source layer, driving dopants of the dopant source layer, and annealing the dopants in the fin structure performed in a same chamber.

6. The method for forming a semiconductor structure as claimed in claim 1, wherein an etching rate of the doped region and an etching rate of the fin structure are different.

7. The method for forming a semiconductor structure as claimed in claim 1, wherein an upper sidewall portion of the source/drain feature has a rounded profile.

8. A method for forming a semiconductor structure, comprising:
    forming a first gate structure over a fin structure in a first region of a substrate;
    forming a second gate structure over the fin structure in a second region of the substrate;
    covering the second gate structure with a first mask layer;
    forming a dopant source layer over the first gate structure and the first mask layer;
    driving dopants of the dopant source layer into the fin structure in the first region;
    removing the dopant source layer;
    laterally diffusing the dopants to form a doped region in the fin structure;
    etching the doped region and the fin structure in the first region and forming a first recess besides the first gate structure in the first region;
    growing a first source/drain feature in the first recess;
    removing the first mask layer; and
    forming a second source/drain feature besides the second gate structure.

9. The method for forming a semiconductor structure as claimed in claim 8, further comprising:
    covering the first gate structure and the first source/drain feature with a second mask layer; and
    etching the fin structure in the second region and forming a second recess besides the second gate structure.

10. The method for forming a semiconductor structure as claimed in claim 8, wherein after etching the doped region and the fin structure in the first region, the doped region has a curved sidewall and the fin structure below the doped region in the first region has a substantially straight sidewall.

11. The method for forming a semiconductor structure as claimed in claim 8, wherein after etching the fin structure in the second region, the fin structure in the second region has a substantially straight sidewall.

12. The method for forming a semiconductor structure as claimed in claim 8, wherein the dopants of the dopant source layer are driven into the fin structure by injecting a gas in the first region.

13. The method for forming a semiconductor structure as claimed in claim 12, wherein the gas and dopants are activated into a plasma to form the doped region in the fin structure.

14. The method for forming a semiconductor structure as claimed in claim 8, wherein the dopants of the dopant source layer are driven into the fin structure vertically.

15. A method for forming a semiconductor structure, comprising:
    forming a first gate structure over a fin structure and in a first region of the fin structure;
    forming first gate spacers over the fin structure and on the opposite sidewalls of the first gate structure;
    performing a deposition process to form a dopant source layer over the first gate structure, the first gate spacers and the fin structure;
    performing a knock-on process to drive dopants of the dopant source layer into the first region of the fin structure;
    removing the dopant source layer; and
    performing an annealing process to diffuse the dopants, so that a doped region is formed in a portion of the fin structure.

16. The method for forming a semiconductor structure as claimed in claim 15, wherein the first deposition process and the first knock-on process are performed in a same chamber of a semiconductor processing system.

17. The method for forming a semiconductor structure as claimed in claim 15, further comprising:
    performing a first etching process to remove the doped region and the underlying fin structure in the first region and not covered by the first gate structure and the first gate spacers; and
    forming first source/drain features in the first region of the fin structure, wherein the first source/drain structure is surrounded by the first doped region.

18. The method for forming a semiconductor structure as claimed in claim 17, wherein the first etching process has a first etching rate during removing the doped region in the first region of the fin structure and has a second etching rate during removing the fin structure underlying the doped region, wherein the first etching rate is different from the second etching rate.

19. The method for forming a semiconductor structure as claimed in claim 15, further comprising:
    forming a first mask pattern over a second region of the fin structure before performing the deposition process, wherein the first mask pattern covers a second gate structure, which is positioned over the fin structure and in the second region of the fin structure;
    removing the first mask pattern after performing the annealing process,
    forming a second mask pattern over the first region of the fin structure after removing the first mask pattern, wherein the second mask pattern covers the first gate and the first spacers;
    forming second spacers on opposite sidewalls of the second gate structure;
    performing a second etching process to remove the fin structure in the second region not covered by the second gate structure; and
    forming second source/drain features in the second region of the fin structure.

20. The method for forming a semiconductor structure as claimed in claim 15, further comprising:
    forming an inter-layer dielectric (ILD) structure over the fin structure, the first gate structure, the first spacers and the first source/drain features;
    removing the first gate electrode to form a trench; and
    filling a metal gate structure in the trench.

* * * * *